(12) United States Patent
Farahi

(10) Patent No.: US 8,463,092 B2
(45) Date of Patent: Jun. 11, 2013

(54) WAVEGUIDE ASSISTED SOLAR ENERGY HARVESTING

(75) Inventor: Faramarz Farahi, Charlotte, NC (US)

(73) Assignee: The University of North Carolina at Charlotte, Charlotte, NC (US)

( * ) Notice: Subject to any disclaimer, the term of this patent is extended or adjusted under 35 U.S.C. 154(b) by 224 days.

(21) Appl. No.: 12/853,867

(22) Filed: Aug. 10, 2010

(65) Prior Publication Data

US 2011/0232211 A1    Sep. 29, 2011

Related U.S. Application Data

(60) Provisional application No. 61/316,917, filed on Mar. 24, 2010.

(51) Int. Cl.
*G02B 6/32* (2006.01)
*G02B 6/30* (2006.01)
*H01L 31/00* (2006.01)
*H01L 25/00* (2006.01)

(52) U.S. Cl.
USPC ............. 385/34; 385/49; 385/900; 136/243; 136/252

(58) Field of Classification Search
USPC ............. 385/900, 31, 33–36, 49; 126/688, 126/689, 692, 693, 699; 136/243, 244, 246, 136/252, 259
See application file for complete search history.

(56) References Cited

U.S. PATENT DOCUMENTS

| 4,193,974 A | 3/1980 | Kotval et al. |
| 4,227,939 A | 10/1980 | Zewail et al. |
| 4,425,907 A | 1/1984 | Younghouse |

(Continued)

FOREIGN PATENT DOCUMENTS

WO    2011119179 A1    9/2011

OTHER PUBLICATIONS

Moyer, P., Benrashid, R., Dupriez, P., Farahi, F., Applications of spin-on-glass for waveguide and micro-optical systems. Micromachining Technology for Micro-optics and Nano-optics, Eric G. Johnson, Editor, Proceedings of SPIE, vol. 4984, 2003. Downloaded from SPIE Digital Library on Nov. 22, 2010. http://spiedl.org/terms, 8 pages.

(Continued)

*Primary Examiner* — Brian Healy
*Assistant Examiner* — Hung Lam
(74) *Attorney, Agent, or Firm* — Tillman Wright, PLLC; James D. Wright; Jeremy C. Doerre

(57) ABSTRACT

A photovoltaic (PV) system includes a fiber optical waveguide comprising an active core that hosts material configured to absorb and emit light, a cladding layer surrounding the active core, the cladding layer being configured to allow ambient light to pass through the cladding layer, and an exit port located proximate an end of the waveguide. The PV system further comprises one or more solar cells disposed at the exit port of the waveguide. The waveguide is configured to guide light to the one or more solar cells. Another photovoltaic (PV) system includes a waveguide comprising an active cladding layer hosting material configured to absorb and emit light, and a core layer configured to confine light emitted by the active cladding layer. The PV system further includes one or more solar cells disposed proximate the waveguide. The core layer is configured to guide light to the one or more solar cells.

20 Claims, 17 Drawing Sheets

U.S. PATENT DOCUMENTS

| | | | |
|---|---|---|---|
| 4,799,748 | A | 1/1989 | Brown |
| 5,703,989 | A | 12/1997 | Khan et al. |
| 6,744,960 | B2 | 6/2004 | Pelka |
| 6,785,447 | B2 | 8/2004 | Yoshimura et al. |
| 6,839,491 | B2 | 1/2005 | Painter et al. |
| 7,067,240 | B2 | 6/2006 | Farahi et al. |
| 7,397,995 | B2 | 7/2008 | Blauvelt et al. |
| 2003/0021324 | A1 | 1/2003 | Filgas |
| 2006/0120679 | A1* | 6/2006 | Hyde .......................... 385/129 |
| 2009/0317044 | A1 | 12/2009 | Buretea et al. |
| 2010/0065110 | A1 | 3/2010 | Birdwell et al. |
| 2010/0229854 | A1* | 9/2010 | Martin-Lopez .............. 126/698 |

OTHER PUBLICATIONS

Vanda, J., Necesany, J., Marsalek, L., Vasinek, V., Basic Characterization of Suspended-core Microstrustured Polymer Optical Fiber, IEEE, 2007, 5 pages.

Herz, E., Ow, H., Bonner, D., Burns, A., Wiesner, U., Dye structure-optical property correlations in near-infrared fluorescent core-shell silica nanoparticles. Journal of Materials Chemistry 2009, pp. 6341-6347. Published on Jun. 25, 2009 on http://pubsrsc.org I doi:10.1039/B902286D. Downloaded by University of North Carolina at Charlotte on Nov. 22, 2010, 7 pages.

Currie, M., Mapel, J., Heidel, T., Goffri, S., Baldo, M., High Efficiency Organic Solar Concentrators for Photovoltaics. Science Magazine, vol. 321, pp. 226-228, 2008. Downloaded from www.sciencemag.org on Nov. 22, 2010. 3 pages.

Strumpel, C., McCann, M., Beaucarne, G., Arkhipov, V., Staoui, A., Svrcek, V., del Canizo, C., Tobia, I., Modifying the solar spectrum to enhance silicon solar cell efficiency—An overview of available materials. Science Direct, solar Energy Materials and Solar Cells, vol. 91, 2007, pp. 238-249, 12 pages.

Karp, J., Tremblay, E., Ford, J., Planar micro-optic solar concentrator, 2010 Optical Society of America. Optics Express, vol. 18, No. 2, pp. 1122-1133, Jan. 18, 2010, 12 pages.

Zhang, J., Noguez, C., Plasminic Optical Properties and Applications of Metal Nanostructures, Springer Science and Business Media LLC 2008, Plasmonics 2008, vol. 3, pp. 127-150, 24 pages.

Kobelke, J., Unger, S., Schuster, K., Schwuchow, A., Kirchhof, J., Recent developments of microstructured fibers for active and passive applicatons, Photonics-2008, International Conference on Fiber Optics and Photonics, Dec. 13-18, 2008, IIT Delhi, India, 4 pages.

Meredith, D., The Luminescent Solar Concentrator: An Illuminating Solution for Solar Energy, Engineering and Science, Jan. 1983, 3 pages.

Forrest, S., The road to high efficiency organic light emitting devices, Science Direct, Organic Electronics, vol. 4, 2003, pp. 45-48, 4 pages.

"International Search Report" and "Written Opinion of the International Search Authority" (United States), in University of North Carolina At Charlotte International Patent Application Serial No. PCT/US2010/045050, dated Dec. 22, 2010, 14 pages.

* cited by examiner

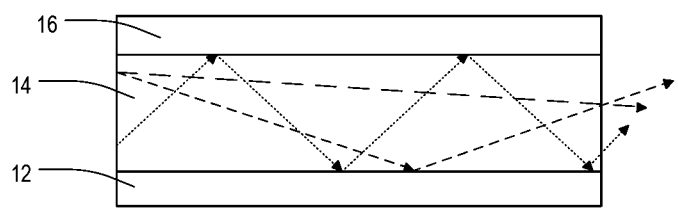
FIG. 1  *Prior Art*
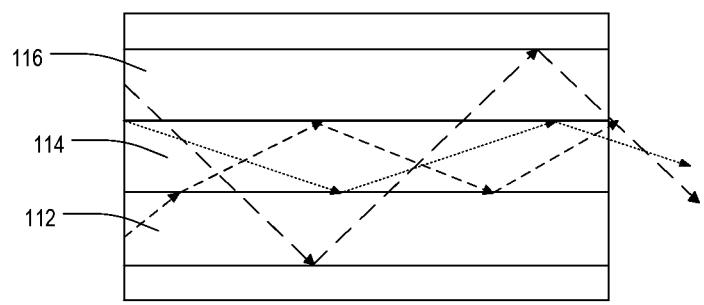
FIG. 2  *Prior Art*

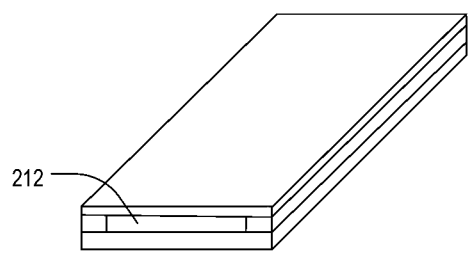
FIG. 3  *Prior Art*
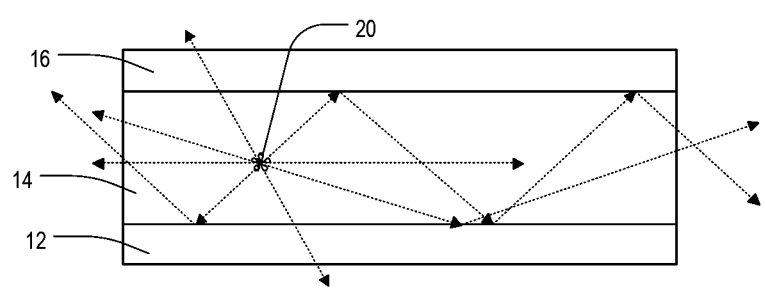
FIG. 4  *Prior Art* even_US 8,463,092 B2

WAVEGUIDE ASSISTED SOLAR ENERGY HARVESTING

CROSS-REFERENCE TO RELATED APPLICATION

The present application is a U.S. nonprovisional patent application of, and claims priority under 35 U.S.C. §119(e) to, U.S. provisional patent application Ser. No. 61/316,917, filed Mar. 24, 2010, which is hereby incorporated herein by reference. A copy of this provisional application is attached hereto as Appendix A, which is hereby incorporated herein by reference.

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE INVENTION

Various types of solar concentrators for solar energy harvesting are known. For example, in 1977, a paper by Ahmed Zewail, Terry Cole, and Barry A. Swartz was published in the Journal of Optics Letters detailing a type of energy cascade concentrator that included several dyes impregnated into a flat sheet. Later developed concentrators stemming from this idea were termed Luminescent Solar Concentrators.

However, a need exists for improvement in solar concentrators. This, and other needs, are addressed by one or more aspects of the present invention.

An overview of several technologies utilized in solar concentrators in accordance with one or more aspects of the present invention will now be provided.

Optical Waveguides

It will be appreciated that an optical waveguide is a structure that guides light from one point of the structure to another. The structure of an optical waveguide can take various forms, i.e. can utilize many possible geometries. For example, a telecommunications fiber is an optical waveguide that has a cylindrical geometry. Other geometries, such as, for example, rectangular geometries, planar or slab geometries, or strip geometries are also possible.

Waveguides having rectangular geometries are commonly called planar or slab waveguides. For example, a slab waveguide might include three layers of materials with different dielectric constants "stacked" on top of one another. It will be appreciated that each layer can be characterized as abutting a layer above or below it at an "interface" of the two layers. Each layer extends in the directions parallel to their interfaces. It will be appreciated that, in practice, waveguides are not able to extend infinitely in the directions parallel to their interfaces, but if the size of their interfaces is much greater than the depth of their layers, the slab waveguide model represents an excellent approximation.

FIG. 1 is a schematic of a cross-section of an exemplary slab waveguide 10. The waveguide 10 includes a middle layer 14 disposed between an upper layer 16 and a lower layer 12. The middle layer 14 can be characterized as a core (i.e. a core layer 14) of the waveguide and has a higher refractive index than the other two layers 12,16, which can be characterized as cladding layers 12,16.

It will be appreciated that, when the thickness of a core layer of a waveguide is large, and/or the difference in the index of refraction of the core layer and the cladding layers is large, beam propagation inside of a waveguide can be fully described by ray optics, and light remains confined owing to the principle of total internal reflection. However, when the thickness of the core layer is smaller (e.g., of the order of a few wavelengths), wave propagation inside of the waveguide is described by Maxwell's equations, and ray optics is no longer applicable. In such waveguides, one or few modes could be formed, but the power density in these structures is typically high, as described in more detail hereinbelow.

In accordance with ray optics, light beams traveling within a waveguide at a certain angle relative to the optical axis of the waveguide will remain confined mostly inside the middle layer of the waveguide and, depending on their direction of propagation, eventually exit out of the waveguide. The maximum angle that a beam can travel at relative to the optical axis and still remain confined is called the critical angle, and this angle depends on the index of refraction of the core and cladding regions.

It will be appreciated that planar waveguides can have many more layers than the exemplary waveguide illustrated in FIG. 1. FIG. 2 illustrates a waveguide 110 that includes three core layers, one central core 114 and two secondary cores 112,116 which have a lower index than the central core, and top and bottom cladding layers. Owing to the relative indices of refraction of the layers, light traveling through the waveguide 110 is primarily concentrated in the central core 114, as illustrated in FIG. 2. Notably, if the central core dimensions are on the order of a few wavelengths, then ray optics (as illustrated in FIG. 2) do not explain the light propagation in this region, but it still describes light propagation in the remaining cladding regions.

Another exemplary waveguide is a channel waveguide, which can be characterized as having a rectangular geometry. A channel waveguide is limited not only by upper and lower cladding layers, but by side claddings as well, and confined light can only exit from exit ports located at ends of the waveguide. FIG. 3 illustrates the cross section of an exemplary channel waveguide 210 having an exit port 212. Notably, although the exemplary channel waveguide illustrated in FIG. 3 includes two side claddings, a waveguide may include only one side cladding, thus creating three exit "ports".

If a point light source is located inside a waveguide, such as for example the exemplary waveguide 10 described hereinabove (either in a core layer 14 or a cladding layer 12,16), such a point light source 20 will emit light in all directions, as illustrated in FIG. 4. Some stray light rays will escape the waveguide 10, while some rays will remain confined until they exit from one of the exit ports of the waveguide 10. FIG. 4 illustrates several confined rays as well as several stray rays, all emitted from the point source 20.

Absorption and Emission of Light

It will be appreciated that certain materials, e.g. chromophores such as dyes and quantum dots, are capable of absorbing and then emitting light. For example, such materials might be capable of absorbing light at and above certain energy (below a wavelength region) and then emitting light with lower energy (higher wavelength). The energy difference between the absorbed and emitted light generates heat, molecular rotation, or vibration.

It will be appreciated that this process of absorption and emission can be characterized as photoluminescence, and materials capable of photoluminescence can be characterized as photoluminescent materials. One type of photoluminescence is fluorescence. Fluorescence occurs when a molecule, atom or nanostructure (such as quantum dots or quantum wires) goes back to its ground state after being initially excited. Excited molecules can also relax via conversion to a triplet state which may subsequently relax via phosphorescence or by a secondary non-radiative relaxation step. Unlike fluorescence, a phosphorescent material does not immediately re-emit the radiation it absorbs and the re-emission is at a lower intensity and could last for up to several hours.

The efficiency of such processes, or quantum efficiency, is defined as the ratio of the number of photons emitted to the number of photons absorbed. For example, a quantum efficiency of 0.5 means that for every two photons absorbed, one photon will be emitted.

Fluorescent lighting is one common application of technology based on this concept. In the past decade or so this concept has been used for white-light LED. The actual LED used for such a white-light source produces light in the blue part of the spectrum, which strikes a phosphor compound deposited on the chip; the phosphor fluoresces from the green to red part of the spectrum. The combination of the blue light that goes through the phosphor and the light emitted by the phosphor produces a net emission of white light.

As an example, the absorption and emission spectra of one type of quantum dots is shown in FIG. 5. In this example, the absorption range is below 570 nm wavelength, and the emission peaks at 550 nm. In this example, the emission spectrum is much narrower than the absorption band.

SUMMARY OF THE INVENTION

The present invention includes many aspects and features. Moreover, while many aspects and features relate to, and are described in, the context of solar concentrators, the present invention is not limited to use only in this context, as will become apparent from the following summaries and detailed descriptions of aspects, features, and one or more embodiments of the present invention.

A first aspect of the present invention relates to a photovoltaic (PV) system. The PV system comprises a fiber optical waveguide including an active core hosting material configured to absorb and emit light, a cladding layer surrounding the active core, the cladding layer being configured to allow ambient light to pass through the cladding layer, and an exit port located proximate an end of the waveguide. The PV system further comprises one or more solar cells disposed at the exit port of the waveguide. The waveguide is configured to guide light to the one or more solar cells.

In a feature of this aspect of the invention, the material comprises a chromophore.

In a feature of this aspect of the invention, the material comprises a photoluminescent material.

In a feature of this aspect of the invention, the material comprises a fluorescent material.

In a feature of this aspect of the invention, the material comprises a phosphorescent material.

In a feature of this aspect of the invention, the material comprises quantum dots.

In a feature of this aspect of the invention, the material comprises a dye.

In a feature of this aspect of the invention, the material comprises an organic dye.

In a feature of this aspect of the invention, a cross-sectional area of the active core of the fiber optical waveguide represents a majority of a cross-sectional area of the fiber optical waveguide.

In a feature of this aspect of the invention, a cross-sectional area of the active core of the fiber optical waveguide represents 75% or more of a cross-sectional area of the fiber optical waveguide.

In a feature of this aspect of the invention, the cross-sectional diameter of the active core is a few microns.

In a feature of this aspect of the invention, the active core has a cross-sectional diameter of a few microns.

In a feature of this aspect of the invention, the one or more solar cells comprise a solar ribbon.

Another aspect of the present invention relates to a fiber optical waveguide that includes an active core hosting material configured to absorb and emit light, a cladding layer surrounding the active core, the cladding layer being configured to allow ambient light to pass through the cladding layer, and an exit port located proximate an end of the waveguide. The waveguide is configured to guide light to the exit port.

Another aspect of the present invention relates to a method of converting light to electrical energy. The method includes steps of absorbing, by a material hosted in a core of a fiber optical waveguide, light; thereafter, emitting, by the material hosted in the core of the fiber optical waveguide, light; guiding, via the fiber optical waveguide, light emitted by the hosted material to a solar cell disposed proximate an exit port of the fiber optical waveguide; and converting, at the solar cell, light guided to the solar cell via the fiber optical waveguide to electrical energy.

Another aspect of the present invention relates to a photovoltaic system that includes a waveguide comprising two or more active core layers, each active core layer hosting material configured to absorb and emit light; and one or more solar cells disposed proximate the waveguide. The waveguide is configured to guide light to the one or more solar cells.

Another aspect of the present invention relates to a waveguide that includes two or more active core layers, each active core layer hosting material configured to absorb and emit light; and an exit port located proximate an end of the waveguide.

In a feature of this aspect of the invention, the waveguide further comprises one or more cladding layers configured to protect one or more of the one or more active core layers from environmental conditions or optical loss.

Another aspect of the present invention relates to a method of converting light to electrical energy. The method includes steps of absorbing, by a material hosted in a first core of a waveguide, light; thereafter, emitting, by the material hosted in the first core of the waveguide, light; absorbing, by a material hosted in a second core of a waveguide, light; thereafter, emitting, by the material hosted in the second core of the waveguide, light; guiding, via the waveguide, light emitted by the material hosted in the first core of the waveguide to a solar cell disposed proximate the waveguide; guiding, via the waveguide, light emitted by the material hosted in the second core of the waveguide to a solar cell disposed proximate the waveguide; converting to electrical energy, at the solar cell, light emitted by the material hosted in the first core of the waveguide that has been guided to the solar cell via the waveguide; and converting to electrical energy, at the solar cell, light emitted by the material hosted in the second core of the waveguide that has been guided to the solar cell via the waveguide.

Another aspect of the present invention relates to a photovoltaic system comprising a waveguide including two or more active core layers, each active core layer hosting material configured to absorb and emit light, and a cladding layer separating two of the two or more active core layers; and one or more solar cells disposed proximate the waveguide. The waveguide is configured to guide light to the one or more solar cells.

Another aspect of the present invention relates to a waveguide that includes two or more active core layers, each active core layer hosting material configured to absorb and emit light, and a cladding layer separating two of the two or more active core layers.

Another aspect of the present invention relates to a photovoltaic system. The photovoltaic system includes a waveguide comprising an active cladding layer hosting material configured to absorb and emit light, and a core layer configured to confine light emitted by the active cladding layer. The photovoltaic system further includes one or more solar cells disposed proximate the waveguide. The core layer is configured to guide light to the one or more solar cells.

Another aspect of the present invention relates to a waveguide that includes an active cladding layer hosting material configured to absorb and emit light; and a core layer configured to confine light emitted by the active cladding layer. The core layer is configured to guide light emitted by the material of the active cladding layer to an edge or end of the waveguide.

Another aspect of the present invention relates to a method of converting light to electrical energy. The method includes the steps of absorbing, by a material hosted in a cladding layer of a waveguide, light; thereafter, emitting, by the material hosted in the cladding layer of the waveguide, light; guiding, via a core layer of the waveguide, light emitted by the hosted material to a solar cell disposed proximate the waveguide; and converting, at the solar cell, light guided to the solar cell via the core layer of the waveguide to electrical energy.

Another aspect of the present invention relates to a fiber optical waveguide. The fiber optical waveguide includes an active core hosting material configured to absorb and emit light; a honeycomb cladding layer surrounding the active core, the honeycomb cladding layer comprising mostly air and being configured to allow ambient light to pass therethrough; and an exit port located proximate an end of the waveguide. The waveguide is configured to guide light to the exit port.

In a feature of this aspect of the invention, the fiber optical waveguide further comprises an outer protective layer configured to allow ambient light to pass therethrough.

In a feature of this aspect of the invention, the outer protective layer is a cladding layer.

In a feature of this aspect of the invention, the fiber optical waveguide further comprises an outer cladding layer configured to allow ambient light to pass therethrough.

In a feature of this aspect of the invention, at least a portion of the fiber optical waveguide is constructed from glass.

In a feature of this aspect of the invention, at least a portion of the fiber optical waveguide is constructed from one or more polymers.

Another aspect of the present invention relates to a photovoltaic system that includes a fiber optical waveguide comprising an active core hosting material configured to absorb and emit light, a honeycomb cladding layer surrounding the active core, the honeycomb cladding layer comprising mostly air and being configured to allow ambient light to pass therethrough, and an exit port located proximate an end of the waveguide. The photovoltaic system further includes one or more solar cells disposed proximate the exit port of the waveguide. The active core layer is configured to guide light to the one or more solar cells.

Another aspect of the present invention relates to a fiber optical waveguide that includes a core; an active cladding layer surrounding the core that hosts material configured to absorb and emit light; a honeycomb cladding layer surrounding the active cladding layer, the honeycomb cladding layer comprising mostly air and being configured to allow ambient light to pass therethrough; and an exit port located proximate an end of the waveguide. The core is configured to confine light emitted by the material hosted in the active cladding layer, and the waveguide is configured to guide light to the exit port.

Another aspect of the present invention relates to a photovoltaic system that includes a fiber optical waveguide comprising a core, an active cladding layer surrounding the core that hosts material configured to absorb and emit light, a honeycomb cladding layer surrounding the active cladding layer, the honeycomb cladding layer comprising mostly air and being configured to allow ambient light to pass therethrough, and an exit port located proximate an end of the waveguide. The photovoltaic system further includes one or more solar cells disposed proximate the exit port of the waveguide. The core is configured to confine light emitted by the material hosted in the active cladding layer, and the waveguide is configured to guide light to the one or more solar cells.

Another aspect of the present invention relates to a method of converting light to electrical energy. The method includes steps of absorbing, by a material hosted in an active cladding layer of a fiber optical waveguide, light; thereafter, emitting, by the material hosted in the active cladding layer of the fiber optical waveguide, light; guiding, via a core of the fiber optical waveguide, light emitted by the hosted material to a solar cell disposed proximate an exit port of the fiber optical waveguide; and converting, at the solar cell, light guided to the solar cell via the fiber optical waveguide to electrical energy.

Another aspect of the present invention relates to a photovoltaic system. The photovoltaic system includes a waveguide comprising three or more core layers; and one or more solar cells disposed proximate the waveguide. An index of refraction of a central core layer of the three or more core layers is greater than indices of refraction of the other core layers of the three or more core layers. Further, at least one of the core layers is an active core layer that hosts material configured to absorb and emit light, and the waveguide is configured to guide light to the one or more solar cells.

In a feature of this aspect of the invention, each core layer of the three or more core layers is an active core layer that hosts material configured to absorb and emit light.

In a feature of this aspect of the invention, the central core layer is an active core layer that hosts material configured to absorb and emit light.

In a feature of this aspect of the invention, the waveguide is configured such that, when the waveguide is illuminated, most of the field resulting therefrom is confined within the central core layer.

Another aspect of the present invention relates to a waveguide. The waveguide includes three or more core layers. An index of refraction of a central core layer of the three or more core layers is greater than indices of refraction of the other core layers of the three or more core layers. Further, at least one of the core layers is an active core layer that hosts material configured to absorb and emit light, and the waveguide is configured to guide light to the one or more solar cells.

Another aspect of the present invention relates to a waveguide. The waveguide includes an upper core layer that hosts a material configured to absorb light having a wavelength below a first value, and emit light having a wavelength above the first value; and a lower core layer that hosts a material configured to absorb light having a wavelength below a second value, and emit light having a wavelength above the second value. The second value is greater than the first value.

In a feature of this aspect of the invention, the upper core layer is configured to scatter light more than the lower core layer.

In a feature of this aspect of the invention, the upper core layer includes one or more scattering elements.

In a feature of this aspect of the invention, the first value is selected to make the upper core layer appear a certain color.

Another aspect of the present invention relates to a photovoltaic system. The photovoltaic system includes a waveguide that comprises an upper core layer that hosts a material configured to absorb light having a wavelength below a first value, and emit light having a wavelength above the first value, and a lower core layer that hosts a material configured to absorb light having a wavelength below a second value, and emit light having a wavelength above the second value. The photovoltaic system further includes one or more solar cells. The waveguide is configured to guide light to the one or more solar cells, and the second value is greater than the first value.

Another aspect of the present invention relates to a waveguide. The waveguide includes an upper core layer that hosts a material configured to absorb light having a wavelength above a first value, and emit light having a wavelength below the first value; and a lower core layer that hosts a material configured to absorb light having a wavelength below a second value, and emit light having a wavelength above the second value. The second value is less than the first value.

Another aspect of the present invention relates to a photovoltaic system that includes a waveguide comprising an upper core layer that hosts a material configured to absorb light having a wavelength above a first value, and emit light having a wavelength below the first value, and a lower core layer that hosts a material configured to absorb light having a wavelength below a second value, and emit light having a wavelength above the second value. The photovoltaic system further includes one or more solar cells. The waveguide is configured to guide light to the one or more solar cells, and the second value is less than the first value.

Another aspect of the present invention relates to a waveguide. The waveguide includes an upper core layer that hosts a material configured to absorb light having a wavelength lying in a certain range, or above or below a certain value, and emit light having a wavelength in a certain range, or above or below a certain value; and a lower core layer. Both the upper core layer and the lower core layer are configured to guide light. The upper core layer is configured to scatter light more than the lower core layer, and one or more of the certain ranges or values are selected so as to cause the upper core layer to visibly appear a certain color.

In a feature of this aspect of the invention, the lower core layer comprises an active layer.

Another aspect of the present invention relates to a photovoltaic system that includes a waveguide comprising an upper core layer that hosts a material configured to absorb light having a wavelength lying in a certain range, or above or below a certain value, and emit light having a wavelength in a certain range, or above or below a certain value, and a lower core layer. The photovoltaic system further includes one or more solar cells. The waveguide is configured to guide light to the one or more solar cells, both the upper core layer and the lower core layer are configured to guide light. Further, the upper core layer is configured to scatter light more than the lower core layer, and one or more of the certain ranges or values are selected so as to cause the upper core layer to visibly appear a certain color.

Another aspect of the present invention relates to a waveguide that includes a plurality of active core layers that each hosts a material configured to absorb light at a respective wavelength band, and emit light. Each active core layer is configured to guide light, and, further, the active core layers are configured such that emitted light from one of the plurality of active core layers that escapes that layer can be absorbed by an adjacent active core layer of the plurality of active core layers.

Another aspect of the present invention relates to a photovoltaic system that includes a waveguide comprising a plurality of active core layers that each hosts a material configured to absorb light at a respective wavelength band, and emit light. The photovoltaic system further includes one or more solar cells. Each active core layer is configured to guide light to one of the one or more solar cells, and the active core layers are configured such that emitted light from one of the plurality of active core layers that escapes that layer can be absorbed by an adjacent active core layer of the plurality of active core layers.

Another aspect of the present invention relates to a method. The method includes steps of absorbing, by a material hosted in a first active core layer of a waveguide, light; thereafter, emitting, by the material hosted in the first active core layer of the waveguide, light; thereafter, absorbing, by a material hosted in a second active core layer of the waveguide, light emitted by the material hosted in the first active core layer of the waveguide; guiding, via the second active core layer of the waveguide, light emitted by the material hosted in the second active core layer of the waveguide to a solar cell disposed proximate the waveguide; and converting, at the solar cell, light guided to the solar cell via the waveguide to electrical energy.

Another aspect of the present invention relates to a photovoltaic system that includes a waveguide comprising two or more active core layers, each active core layer hosting material configured to absorb and emit light, and each active core layer being configured to confine light emitted by material hosted in that active core layer, and one or more cladding layers separating each of the two or more active core layers. The photovoltaic system further includes one or more solar cells disposed proximate the waveguide, and the waveguide is configured to guide light to the one or more solar cells. The waveguide is configured to minimize re-absorption of light emitted by material hosted in any of the active core layers.

Another aspect of the present invention relates to a waveguide that includes two or more active core layers, each active core layer hosting material configured to absorb and emit light, and each active core layer being configured to confine light emitted by material hosted in that active core layer, and one or more cladding layers separating each of the two or more active core layers. The waveguide is configured to guide light, and is configured to minimize re-absorption of light emitted by material hosted in any of the active core layers.

Another aspect of the present invention relates to a photovoltaic system that includes a waveguide comprising two or more active core layers, each active core layer hosting material configured to absorb and emit light, and a cladding layer separating two of the two or more active core layers. The photovoltaic system further includes one or more solar cells disposed proximate the waveguide. The waveguide is configured to guide light to the one or more solar cells, and the hosting material for at least one of the active core layers is selected to shift the wavelength of light guided by the waveguide to light having a wavelength that can be efficiently utilized by the one or more solar cells.

Another aspect of the present invention relates to a photovoltaic system. The photovoltaic system includes one or more solar cells, and a waveguide comprising two or more active core layers, each active core layer hosting material configured to absorb light having a wavelength that is not easily utilized by the one or more solar cells, and emit light that is easily utilized by the one or more solar cells, and a cladding layer separating two of the two or more active core layers. The waveguide is configured to guide light to the one or more solar cells.

In a feature of this aspect of the invention, at least one of the two or more active core layers is configured for energy up-conversion, and at least one other of the two or more active core layers is configured for energy down-conversion.

Another aspect of the present invention relates to a method. The method includes steps of absorbing, by a material hosted in a first active core layer of a waveguide, light having a wavelength that is not easily utilized by one or more solar cells disposed proximate the waveguide; thereafter, emitting, by the material hosted in the first active core layer of the waveguide, light having a wavelength that is easily utilized by the one or more solar cells disposed proximate the waveguide; absorbing, by a material hosted in a second active core layer of the waveguide, light having a wavelength that is not easily utilized by the one or more solar cells disposed proximate the waveguide; thereafter, emitting, by the material hosted in the second active core layer of the waveguide, light having a wavelength that is easily utilized by the one or more solar cells disposed proximate the waveguide; guiding, via the first and second active core layers of the waveguide, light emitted by the material hosted in the first and second active core layers of the waveguide to the one or more solar cells disposed proximate the waveguide; and converting, at the one or more solar cells, light guided to the one or more solar cells via the waveguide to electrical energy.

In a feature of this aspect of the invention, the absorption and emission by the material hosted in the first active core layer is a fluorescent process.

In a feature of this aspect of the invention, the absorption and emission by the material hosted in the first active core layer is a phosphorescent process.

In a feature of this aspect of the invention, the absorption and emission by the material hosted in the first active core layer are part of a linear multi-photon absorption process.

In a feature of this aspect of the invention, the absorption and emission by the material hosted in the first active core layer are part of a non-linear multi-photon absorption process.

Another aspect of the present invention relates to a method. The method includes steps of absorbing, by a material hosted in a layer of a waveguide, light having a wavelength that is not easily utilized by one or more solar cells disposed proximate the waveguide; thereafter, emitting, by the material hosted in the layer of the waveguide, light having a wavelength that is easily utilized by the one or more solar cells disposed proximate the waveguide; guiding, via the waveguide, light emitted by the material hosted in the layer of the waveguide to the one or more solar cells disposed proximate the waveguide; and converting, at the one or more solar cells, light guided to the one or more solar cells via the waveguide to electrical energy.

In a feature of this aspect of the invention, the absorption and emission by the material hosted in the layer are part of a linear multi-photon absorption process.

In a feature of this aspect of the invention, the absorption and emission by the material hosted in the layer are part of a non-linear multi-photon absorption process.

In a feature of this aspect of the invention, the material comprises calcium sulphide based europium-samarium.

In a feature of this aspect of the invention, the material comprises calcium sulphide based cerium-samarium.

Another aspect of the present invention relates to a method. The method includes steps of converting, at a waveguide utilizing Plasmon resonance, light having a wavelength that is not easily utilized by one or more solar cells disposed proximate the waveguide to light having a wavelength that is easily utilized by the one or more solar cells disposed proximate the waveguide; guiding, via the waveguide, converted light to the one or more solar cells disposed proximate the waveguide; and converting, at the one or more solar cells, light guided to the one or more solar cells via the waveguide to electrical energy.

Another aspect of the present invention relates to a photovoltaic system. The system includes one or more solar cells and a waveguide comprising a lower layer incorporating metal nanoparticles, the lower layer being configured to convert, utilizing Plasmon resonance, light having a wavelength that is not easily utilized by the one or more solar cells disposed to light having a wavelength that is easily utilized by the one or more solar cells disposed proximate the waveguide, and at least one core layer configured to guide light to the one or more solar cells.

Another aspect of the present invention relates to a method of applying a waveguide structure to a surface. The method includes steps of applying a first cladding layer to the surface; and applying a core layer to the surface, the core layer being disposed on top of the first cladding layer. The core layer has a higher index of refraction than the first cladding layer.

In a feature of this aspect of the invention, the method further comprises applying a second cladding layer to the surface, the second cladding layer being disposed on top of the core layer, and wherein the core layer has a higher index of refraction than the second cladding layer.

In a feature of this aspect of the invention, the method further comprises, prior to said step of applying a first cladding layer to the surface, a step of applying a reflective coating to the surface.

In a feature of this aspect of the invention, the surface comprises a cylindrical surface.

In a feature of this aspect of the invention, the first cladding layer and the core layer are both applied at the same time.

In a feature of this aspect of the invention, the core layer is an active core layer that hosts a material configured to absorb and emit light.

In a feature of this aspect of the invention, the first cladding layer is an active cladding layer that hosts a material configured to absorb and emit light.

In a feature of this aspect of the invention, the second cladding layer is an active cladding layer that hosts a material configured to absorb and emit light.

In a feature of this aspect of the invention, one or more of the layers are applied via spin coating.

In a feature of this aspect of the invention, one or more of the layers are applied via spray coating.

In a feature of this aspect of the invention, one or more of the layers are applied via brushing.

In a feature of this aspect of the invention, one or more of the layers are applied via mist coating.

In a feature of this aspect of the invention, one or more of the layers are applied via dipping.

In a feature of this aspect of the invention, one or more of the layers are applied via rolling.

In a feature of this aspect of the invention, one or more of the layers are applied as a film.

In a feature of this aspect of the invention, the first cladding layer, the core layer, and the second cladding layer are all applied at the same time.

In a feature of this aspect of the invention, the method further comprises applying a core layer configured to display a particular color when illuminated.

Another aspect of the present invention relates to a curved solar collector. The curved solar collector includes a waveguide structure applied to a curved surface, the waveguide structure including an active layer hosting material configured to absorb and emit light, and one or more solar cells disposed proximate the waveguide structure. The waveguide structure is configured to guide light to the one or more solar cells.

In a feature of this aspect of the invention, the curved surface comprises a pole.

Another aspect of the present invention relates to a photovoltaic system. The photovoltaic system includes glass, an active waveguide layer that is applied to a surface of the glass, the active waveguide layer hosting material configured to absorb and emit light, and one or more solar cells. The index of refraction of the glass surface is greater than or equal to the index of refraction of the active waveguide layer, and light emitted by the material hosted in the active layer propagates to the one or more solar cells through one or more of the glass and the active waveguide layer.

In a feature of this aspect of the invention, the system includes one or more applied cladding layers.

In a feature of this aspect of the invention, the active waveguide layer is one of two applied active waveguide layers.

Another aspect of the present invention relates to a photovoltaic system. The photovoltaic system includes glass, an active waveguide layer that is applied to a surface of the glass, the active waveguide layer hosting material configured to absorb and emit light, and one or more solar cells. The index of refraction of the glass surface is less than the index of refraction of the active waveguide layer, and light emitted by the material hosted in the active layer propagates to the one or more solar cells through the active waveguide layer, and the glass functions as a cladding layer.

Another aspect of the present invention relates to a method of installing a photovoltaic system. The method includes steps of installing, proximate a piece of glass, one or more solar cells; and applying, to a surface of the piece of glass, a waveguide structure including an active layer that hosts a material configured to absorb and emit light. Following application of the waveguide structure, light emitted by the material hosted in the active layer of the waveguide structure is guided by one or more of the waveguide structure and the piece of glass to the one or more solar cells.

Another aspect of the present invention relates to laminated glass. The laminated glass includes first and second pieces of glass, and an active adhesive layer which adheres the first and second pieces of glass together, the active adhesive layer hosting a material configured to absorb and emit light. The index of refraction of the adhesive layer is higher than the index of refraction of either of the pieces of glass such that light emitted by the material mostly travels in the active adhesive layer.

In a feature of this aspect of the invention, the adhesive layer comprises polyvinyl butyral (PVB).

In a feature of this aspect of the invention, the adhesive layer comprises ethylene-vinyl acetate (EVA).

In a feature of this aspect of the invention, the adhesive layer comprises optical fiber.

In a feature of this aspect of the invention, the adhesive layer comprises a pigment.

In a feature of this aspect of the invention, the adhesive layer comprises a dye.

Another aspect of the present invention relates to a photovoltaic system that includes laminated glass comprising first and second pieces of glass, and an active adhesive layer which adheres the first and second pieces of glass together, the active adhesive layer hosting a material configured to absorb and emit light. The photovoltaic system further includes one or more solar cells. The index of refraction of the adhesive layer is higher than the index of refraction of either of the pieces of glass such that light emitted by the material mostly travels through the active adhesive layer to the one or more solar cells.

Another aspect of the present invention relates to laminated glass. The laminated glass includes first and second pieces of glass, and an active adhesive layer which adheres the first and second pieces of glass together, the active adhesive layer hosting a material configured to absorb and emit light. The index of refraction of the adhesive layer is lower than the index of refraction of either of the pieces of glass such that light emitted by the material mostly travels in the pieces of glass.

Another aspect of the present invention relates to a photovoltaic system. The photovoltaic system includes laminated glass comprising first and second pieces of glass, and an active adhesive layer which adheres the first and second pieces of glass together, the active adhesive layer hosting a material configured to absorb and emit light. The photovoltaic system further includes one or more solar cells. The index of refraction of the adhesive layer is lower than the index of refraction of either of the pieces of glass such that light emitted by the material mostly travels through the pieces of glass to the one or more solar cells.

Another aspect of the present invention relates to a photovoltaic system that includes one or more solar cells, a waveguide configured to guide light to an area proximate the one or more solar cells, and an optical structure configured to redirect light. The waveguide hosts material configured to absorb and emit light.

In a feature of this aspect of the invention, the optical structure comprises a grating.

In a feature of this aspect of the invention, the optical structure comprises a prism.

In a feature of this aspect of the invention, the optical structure comprises an angled surface.

In a feature of this aspect of the invention, the optical structure comprises a right-angle structure.

In a feature of this aspect of the invention, the optical structure comprises a reflector.

In a feature of this aspect of the invention, the optical structure comprises a scattering surface.

In a feature of this aspect of the invention, the optical structure is utilized to couple light into the waveguide directly.

Another aspect of the present invention relates to fabric that includes a plurality of fiber optic waveguides. At least one of the fiber optic waveguides hosts a material configured to absorb and emit light.

In a feature of this aspect of the invention, the fabric comprises woven fabric.

In a feature of this aspect of the invention, the fabric comprises non-woven fabric.

Another aspect of the present invention relates to a photovoltaic system that includes fabric constructed from a plurality of fiber optic waveguides, at least one of the fiber optic waveguides hosting a material configured to absorb and emit light, and one or more solar cells. The fabric is configured to guide light to the one or more solar cells.

Another aspect of the present invention relates to an article of clothing that comprises fabric constructed from a plurality of fiber optic waveguides, at least one of the fiber optic waveguides hosting a material configured to absorb and emit light, and one or more solar cells. The fabric is configured to guide light to the one or more solar cells.

Another aspect of the present invention relates to a photovoltaic system that includes fabric constructed from a plurality of fiber optic waveguides, at least one of the fiber optic waveguides hosting a material configured to absorb and emit light, one or more solar cells, and one or more heating or cooling elements. The fabric is configured to guide light to the one or more solar cells for conversion to electrical energy to be used in powering the one or more heating or cooling elements.

Another aspect of the present invention relates to a photovoltaic system that includes fabric constructed from a plurality of fiber optic waveguides, at least one of the fiber optic waveguides hosting a material configured to absorb and emit light, one or more solar cells, and one or more energy storage elements. The fabric is configured to guide light to the one or more solar cells for conversion to electrical energy to be stored in the one or more energy storage elements.

In a feature of this aspect of the invention, the one or more energy storage elements include a battery.

In a feature of this aspect of the invention, the one or more energy storage elements include a capacitor.

In a feature of this aspect of the invention, the one or more energy storage elements comprise layered energy storage elements.

In a feature of this aspect of the invention, the one or more energy storage elements are configured to be able to provide power to a mobile electronic device.

In a feature of this aspect of the invention, the system further comprises a mobile electronic device, and the one or more energy storage elements are configured to be able to provide power to the mobile electronic device.

Another aspect of the present invention relates to a photovoltaic system that includes fabric constructed from a plurality of fiber optic waveguides, at least one of the fiber optic waveguides hosting a material configured to absorb and emit light, one or more solar cells, one or more heating or cooling elements, and one or more energy storage elements. The fabric is configured to guide light to the one or more solar cells for conversion to electrical energy to be used in powering the one or more heating or cooling elements or stored in the energy storage elements for later use in powering the one or more heating elements.

Another aspect of the present invention relates to a photovoltaic system that includes a waveguide that hosts a material configured to absorb and emit light, one or more solar cells, and one or more energy storage elements. The fabric is configured to guide light to the one or more solar cells for conversion to electrical energy to be stored in the one or more energy storage elements.

In a feature of this aspect of the invention, the one or more energy storage elements are configured to be able to provide power to a mobile electronic device via a plug or outlet.

Another aspect of the present invention relates to paint comprising a material configured to absorb and emit light, the paint being configured such that application of the paint to a surface effects application of a waveguide structure that hosts the material and that is configured to guide light.

Another aspect of the present invention relates to a building component that includes a first structural layer configured to be transparent to light, a second structural layer, and a first fabric layer sandwiched between the first and second structural layers. The first fabric layer is constructed from a plurality of fiber optic waveguides, at least one of the fiber optic waveguides hosting a material configured to absorb and emit light.

In a feature of this aspect of the invention, the building component further comprises a second fabric layer disposed between the first fabric layer and one of the structural layers, the second fabric layer being constructed from a plurality of fiber optic waveguides, at least one of the fiber optic waveguides of the second fabric layer hosting a material configured to absorb and emit light.

In a feature of this aspect of the invention, the first fabric layer is configured for energy up-conversion, and the second fabric layer is configured for energy down-conversion.

Another aspect of the present invention relates to a photovoltaic system that includes a building component comprising a first structural layer configured to be transparent to light, a second structural layer, and fabric sandwiched between the first and second structural layers. The photovoltaic system further includes one or more solar cells. The fabric is constructed from a plurality of fiber optic waveguides and is configured to guide light to the one or more solar cells, and at least one of the fiber optic waveguides hosts a material configured to absorb and emit light.

Another aspect of the present invention relates to a waveguide structure comprising one or more active layers which absorb light and emit light at higher and/or lower wavelengths, thereby tuning light wavelengths to a region of higher efficiency of solar cells.

Another aspect of the present invention relates to a waveguide structure comprising multiple active layers for different regions of the spectral band so as to reduce re-absorption.

Another aspect of the present invention relates to a waveguide structure comprising an active cladding layer and a passive core.

Another aspect of the present invention relates to a waveguide structure comprising one or more layers which absorbs light having short wavelengths and emits light having longer wavelengths appropriate for a particular solar cell.

Another aspect of the present invention relates to a waveguide structure comprising one or more layers which absorbs light having long wavelengths and emits light having shorter wavelengths appropriate for a particular solar cell.

Another aspect of the present invention relates to a waveguide structure comprising one or more layers which absorb light having long wavelengths and convert it, via plasmon resonance, to light having shorter wavelengths appropriate for a particular solar cell.

Another aspect of the present invention relates to a one dimensional waveguide structure with an active core region.

Another aspect of the present invention relates to a one dimensional waveguide structure with an active cladding region.

Another aspect of the present invention relates to a one dimensional waveguide structure with an active core region, where air cladding is utilized.

Another aspect of the present invention relates to a one dimensional waveguide structure with two or more cladding layers, where one or more cladding layers are active.

Another aspect of the present invention relates to a waveguide structure as disclosed herein where one or more edges of the waveguide structure include a reflective coating.

Another aspect of the present invention relates to a planar waveguide structure applied on a surface that includes one or more of the following layers: planarized layers, cladding layers, active cladding layers, passive core layers, active core layers, active layers configured to generate custom colors, active layers which work at different wavelengths bands, and protective layers.

In a feature of this aspect of the invention, such a waveguide structure is applied on regular glass.

In a feature of this aspect of the invention, such a waveguide structure is applied on glass of a window.

In a feature of this aspect of the invention, such a waveguide structure is applied on glass of a door.

In a feature of this aspect of the invention, such a waveguide structure is applied on a wooden surface such as a door.

In a feature of this aspect of the invention, such a waveguide structure is applied on siding.

In a feature of this aspect of the invention, such a waveguide structure is applied on shutters.

In a feature of this aspect of the invention, such a waveguide structure is applied on an interior wall.

In a feature of this aspect of the invention, such a waveguide structure is applied on an exterior wall.

In a feature of this aspect of the invention, such a waveguide structure is applied on a metal surface.

In a feature of this aspect of the invention, such a waveguide structure is applied on a fiber glass surface.

In a feature of this aspect of the invention, such a waveguide structure is applied on a surface of a car.

In a feature of this aspect of the invention, such a waveguide structure is applied on a surface of a truck.

In a feature of this aspect of the invention, such a waveguide structure is applied on a car dashboard.

In a feature of this aspect of the invention, such a waveguide structure is applied on one or more roofing tiles.

In a feature of this aspect of the invention, such a waveguide structure is applied on a curved surface.

In a feature of this aspect of the invention, such a waveguide structure is applied on a post for a traffic light.

In a feature of this aspect of the invention, such a waveguide structure is applied on a post for a street light.

In a feature of this aspect of the invention, such a waveguide structure is applied on a cell-phone tower.

In a feature of this aspect of the invention, such a waveguide structure is applied on a road sign.

In a feature of this aspect of the invention, such a waveguide structure is applied on a billboard.

In a feature of this aspect of the invention, such a waveguide structure is painted on a bridge.

Another aspect of the present invention relates to a method comprising delivering light from a waveguide as disclosed herein to one or more solar cells via a prism for out of plane installation of solar cells.

Another aspect of the present invention relates to a method comprising delivering light from a waveguide as disclosed herein to one or more solar cells via one or more micro lenses.

Another aspect of the present invention relates to a method comprising delivering light from a waveguide as disclosed herein to one or more solar cells via one or more cylindrical lenses.

Another aspect of the present invention relates to a method comprising delivering light from a waveguide as disclosed herein to one or more solar cells via one or more nano-structures at the edges of the waveguide.

In a feature of this aspect of the invention, the edges include anti-reflective coatings.

Another aspect of the present invention relates to a multi-layer structure configured for collection of light via a waveguide and energy storage utilizing capacitors and/or batteries.

Another aspect of the present invention relates to woven fabric comprising fiber waveguides.

Another aspect of the present invention relates to non-woven fabric comprising fiber waveguides.

Another aspect of the present invention relates to fabric that is utilized for clothing.

Another aspect of the present invention relates to fabric that is utilized for clothing for a soldier.

Another aspect of the present invention relates to fabric that is utilized for clothing for a hiker.

Another aspect of the present invention relates to fabric that is utilized for clothing for a runner.

Another aspect of the present invention relates to fabric that is utilized for clothing configured for charging of a battery powered electronic device.

Another aspect of the present invention relates to fabric that is utilized in combination with one or more heating or cooling elements to heat-up or cool-down an inner layer of a cloth.

Another aspect of the present invention relates to fabric that is utilized in a car seat.

Another aspect of the present invention relates to fabric that is utilized for car upholstery.

Another aspect of the present invention relates to fabric that is utilized in a tent.

Another aspect of the present invention relates to fabric that is utilized to make a pad.

Another aspect of the present invention relates to fabric that is utilized to make a mouse pad.

Another aspect of the present invention relates to fabric that is utilized to make an arm bad, the arm band being configured to be worn by a user for powering or charging a mobile electronic device.

Another aspect of the present invention relates to fabric that is utilized in a brief case.

Another aspect of the present invention relates to fabric that is utilized in a back-pack.

Another aspect of the present invention relates to fabric that is utilized in a computer case.

Another aspect of the present invention relates to fabric that is utilized in a laptop sleeve.

Another aspect of the present invention relates to fabric that is utilized in a roll-up/fold-up mat configured to form a huge photo-collector area.

Another aspect of the present invention relates to fabric that is utilized for curtains.

Another aspect of the present invention relates to fabric that is utilized for an awning.

Another aspect of the present invention relates to fabric that is utilized for a canopy.

Another aspect of the present invention relates to fabric that is utilized as sheeting for a roof.

Another aspect of the present invention relates to fabric that is utilized as insulating material for a roof.

Another aspect of the present invention relates to fabric that is utilized in a patio umbrella.

Another aspect of the present invention relates to fabric that is utilized for blinds.

Another aspect of the present invention relates to fabric that is utilized for French shutters.

Another aspect of the present invention relates to fabric that is utilized in a side window shield for a car.

Another aspect of the present invention relates to fabric that is utilized in a rear window shield for a car.

Another aspect of the present invention relates to fabric that is utilized in a window shield for an RV.

Another aspect of the present invention relates to fabric that is utilized in a window shield for a truck.

Another aspect of the present invention relates to fabric that is utilized in a seat cover for a vehicle.

Another aspect of the present invention relates to fabric that is utilized for a vehicle mat.

Another aspect of the present invention relates to a waveguide.

Another aspect of the present invention relates to a fiber optical waveguide.

Another aspect of the present invention relates to a slab waveguide.

Another aspect of the present invention relates to a waveguide having a rectangular geometry.

Another aspect of the present invention relates to a multi-layer waveguide.

Another aspect of the present invention relates to a waveguide comprising multiple core layers.

Another aspect of the present invention relates to a photovoltaic system.

Another aspect of the present invention relates to woven fabric.

Another aspect of the present invention relates to a non-woven fabric.

Another aspect of the present invention relates to a method of applying a waveguide structure to a surface.

Another aspect of the present invention relates to a method of converting light to electrical energy.

Another aspect of the present invention relates to a method of constructing a photovoltaic system.

Another aspect of the present invention relates to a method of utilizing a photovoltaic system.

Another aspect of the present invention relates to a method of for maximizing the efficiency of a solar cell.

Another aspect of the present invention relates to a method utilizing Plasmon resonance.

Another aspect of the present invention relates to a method utilizing multi-photon absorption.

Another aspect of the present invention relates to paint.

Another aspect of the present invention relates to fluorescent paint.

Another aspect of the present invention relates to building material.

Another aspect of the present invention relates to tempered glass.

Another aspect of the present invention relates to a photovoltaic system comprising one or more optical structures.

Another aspect of the present invention relates to clothing constructed from fabric.

Another aspect of the present invention relates to a photovoltaic apparatus comprising a waveguide and heating or cooling elements.

Another aspect of the present invention relates to a photovoltaic apparatus configured to charge or power a mobile electronic device.

In addition to the aforementioned aspects and features of the present invention, it should be noted that the present invention further encompasses the various possible combinations and subcombinations of such aspects and features.

BRIEF DESCRIPTION OF THE DRAWINGS

One or more preferred embodiments of the present invention now will be described in detail with reference to the accompanying drawings, wherein the same elements are referred to with the same reference numerals, and wherein:

FIG. 1 is a schematic of a cross-section of an exemplary slab waveguide;

FIG. 2 illustrates a waveguide that includes three core layers and top and bottom cladding layers;

FIG. 3 illustrates the cross section of an exemplary channel waveguide;

FIG. 4 illustrates the travel of exemplary light rays emitted from a point light source located within the exemplary waveguide of FIG. 1;

DETAILED DESCRIPTION

Figure 5:
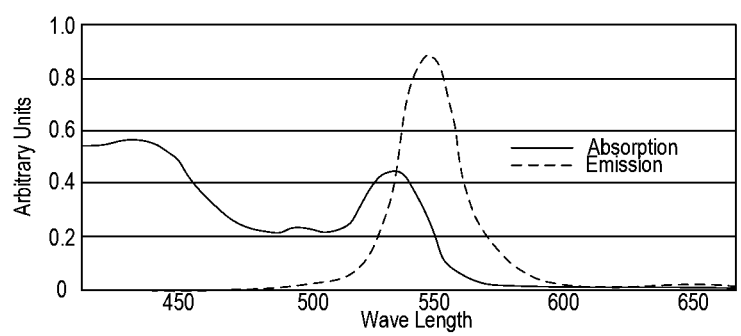
FIG. 5 illustrates the absorption and emission spectra of one type of quantum dots.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. As should be understood, any embodiment may incorporate only one or a plurality of the above-disclosed aspects of the invention and may further incorporate only one or a plurality of the above-disclosed features. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Regarding applicability of 35 U.S.C. §112, ¶6, no claim element is intended to be read in accordance with this statutory provision unless the explicit phrase "means for" or "step for" is actually used in such claim element, whereupon this statutory provision is intended to apply in the interpretation of such claim element.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, one or more preferred embodiments of the present invention are next described. The following description of one or more preferred embodiments is merely exemplary in nature and is in no way intended to limit the invention, its implementations, or uses.

Overview

A solar concentrator in accordance with one or more aspects of the present invention comprises a material capable of absorbing and emitting light and an optical waveguide configured to guide light emitted by the material. A photovoltaic (PV) device or system in accordance with one or more aspects of the present invention comprises one or more PV cells, or solar cells, and such a solar concentrator configured to guide light to the one or more PV cells. For example, in one or more preferred implementations, fluorescent material that will generate light at longer wavelengths when illuminated by ambient light is disposed within a waveguide of a solar concentrator. The waveguide guides light to narrow strips of solar cells at exit ports of the waveguide where such light is then converted to electricity.

Implementations of PV systems and devices, solar concentrators, waveguides, and methodologies associated therewith, in accordance with aspects of the present invention will now be described.

Wavelength Modification

In one or more preferred implementations, a waveguide includes one or more "active" layers or regions. Such layers or regions are characterized as active because the layers or regions host a material with the ability to absorb light (for example part of the spectrum of sun light) and thereafter emit light. This emission of light by material hosted within an active layer or region of a waveguide can be thought of as representing a very large number of point sources of light within the waveguide.

In preferred implementations, this hosted material is a photoluminescent material, such as, for example, a fluorescent material or a phosphorescent material. In some preferred implementations, this material is hosted in a core layer of the waveguide, while in other preferred implementations, this material is hosted in a cladding layer of the waveguide. In some implementations, such material is hosted in both a core layer and a cladding layer of the waveguide.

Figure 6:
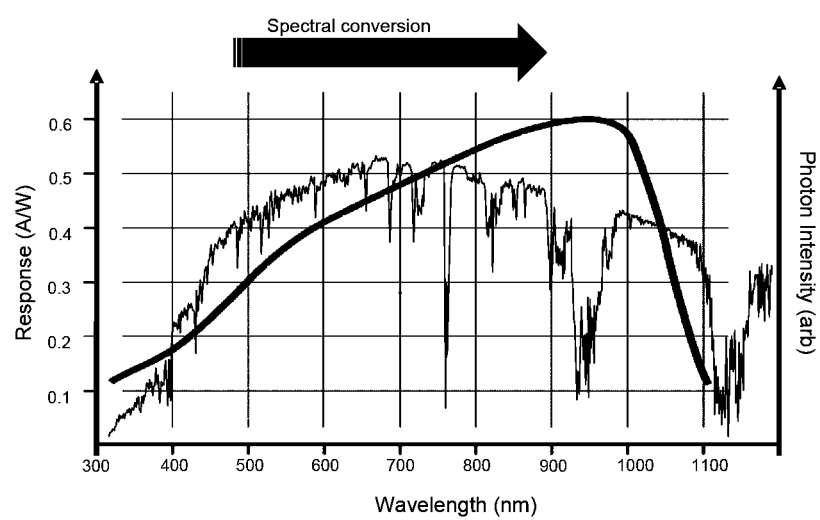
FIG. 6 is a graph corresponding to an exemplary frequency shifting process.

In a preferred implementation, light from the UV and high frequency region of the visible spectrum is frequency down shifted to approach a maximum of the efficiency curve of a solar cell the waveguide guides light to. FIG. 6 illustrates such frequency shifting. For a silicon based solar cell, efficiency peaks at approximately 950 nm, so shifting the wavelength of light to approach this value would increase electrical power generation of the solar cell. In one or more preferred implementations, the wavelength of light is shifted to approach this value.

Figure 7:
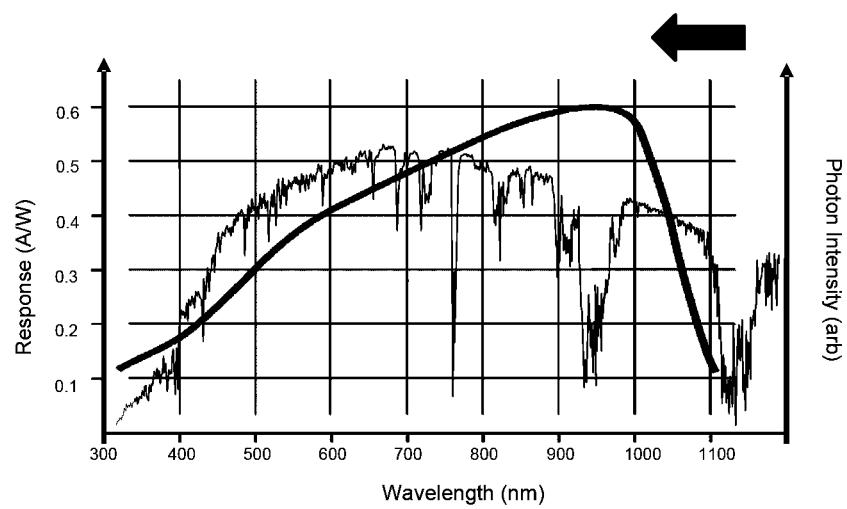
FIG. 7 is a graph corresponding to an exemplary multi-photon absorption process.

As noted hereinabove, fluorescence and phosphorescence are not the only mechanisms which can be utilized to shift the wavelength of light. Multi photon absorption (MTP) is a mechanism in which the simultaneous absorption of multiple photons of identical or different frequencies excites a molecule from a first state to a higher energy state. The energy difference between the first state and the higher energy state is equal to the sum of the energies of absorbed photons. MTP can be a linear or non-linear process. Linear processes are more efficient and, for example, could be utilized to convert infrared wavelength light into near infrared or visible light which is more suitable for a solar cell. FIG. 7 illustrates an exemplary such conversion process.

In one or more preferred implementations, linear and/or non-linear MTP processes are utilized to convert light from one wavelength to another, such as, for example, from infrared wavelength light into near infrared or visible light.

In at least some preferred implementations, silicon solar cells which do not absorb light having a wavelength above 1100 nm are utilized, thus causing part of the sun's spectrum to be completely unused. In one or more preferred implementations, however, MTP is utilized to convert some or all of this unutilized light to light having a lower wavelength which can be utilized by the silicon solar cell. For example, in one or more preferred implementations, calcium sulphide based europium-samarium, which absorbs light having a wavelength of 800-1400 nm and emits light at the red region of the spectrum (around 650 nm) and/or calcium sulphide based cerium-samarium, which absorbs light having a wavelength of 800-1400 nm and emits light at the green region of the spectrum (around 510 nm) are utilized.

Another mechanism for conversion of long wavelength infrared light to shorter wavelength light is surface plasmons. Surface plasmons are surface electromagnetic waves that propagate in a direction parallel to a metal/dielectric interface. When the surface plasmons waves hit a local particle or irregularity—like on a rough surface—part of the energy can be re-emitted as light. This emitted light can be detected behind a metal surface in various directions, therefore acting like the point source illustrated in FIG. 4.

Energy Conversion

A process of converting solar energy to electrical energy in accordance with one or more preferred implementations will now be described. First, a waveguide is illuminated by ambient light. The ambient light is absorbed and emitted, and the emitted light is partially guided to narrow strips of solar cells (solar ribbons) at the exit ports of the waveguide. The solar ribbons absorb light guided to them and generate electricity. In one or more preferred implementations, the effective area in which the waveguide is illuminated is very large, and the solar cells are only located at exit ports of the waveguide, thus only requiring a very narrow matrix of solar cells to harvest the solar energy of a very large area. Preferably, efficiency of a solar cell in such a system is increased because, as the guided light at the exit ports of a waveguide structure represents a collection of light from the entire structure, the intensity at any exit port is always high, thereby allowing such a system to operate under very low light level conditions as compared to a typical solar cell, which requires a minimum light level to generate an electrical signal above a noise limit. In one or more preferred implementations, antireflective structures are incorporated at exit ports of a waveguide or on the surface of a solar cell to increase efficiency.

Figure 8A:
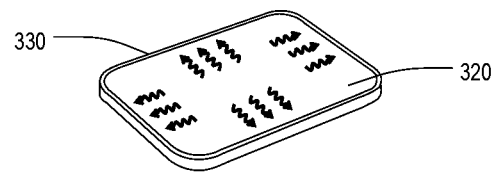
FIG. 8A illustrates a photovoltaic device in accordance with one or more aspects of the present invention.
Figure 8B:
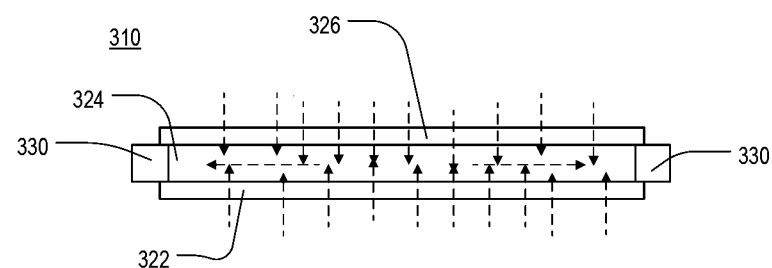
FIG. 8B is a cross-sectional view of the photovoltaic device of FIG. 8A.

FIG. 8A illustrates a PV device 310 in accordance with one or more preferred implementations. The PV device 310 comprises planar waveguide 320 and a solar ribbon 330 disposed around all of its edges. FIG. 8B is a cross-sectional view of the PV device 310 where upper and lower cladding layers 322, 326 of the waveguide 320 are transparent to illuminated light and have a lower index of refraction than the core layer 324. Preferably, in addition to their optical functionality, the cladding layers 322,326 protect the core layer 324 from the outside environment and surfaces that might cause optical loss. Preferably, the waveguide structure allows in-plane and out-of-plane bends with no or minimal loss.

Figure 9:
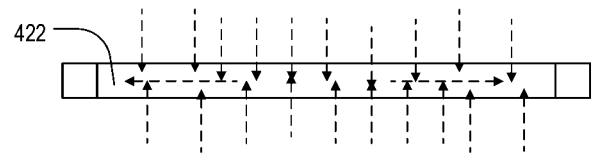
FIG. 9 illustrates an air clad photovoltaic device in accordance with one or more aspects of the present invention.

FIG. 9 illustrates another PV device 410 in accordance with one or more preferred implementations. In contrast to the PV device 310, rather than including cladding layers, such as cladding layers 322,326, the core 422 of the waveguide of the PV device 410 is air clad.

It will be appreciated that PV device 310 and PV device 410 are exemplary PV devices. In preferred implementations, physical cladding and/or air may be used as cladding for one or more core layers of a waveguide of a PV device or system.

In accordance with various implementations, varying technologies for converting light to electrical energy could be utilized. It is contemplated that any suitable technology could be utilized in accordance with one or more implementations.

Fiber Waveguides

Figure 10A:
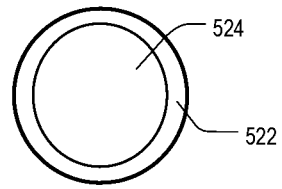
FIGS. 10A-D illustrate exemplary fiber waveguides in accordance with one or more aspects of the present invention.
Figure 10B:
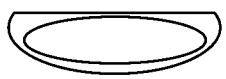
Figure 10C:
Figure 10D:
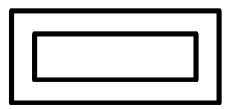

In some preferred implementations, fiber optical waveguides are utilized in a PV system or device. FIG. 10A illustrates an exemplary cylindrical fiber waveguide 520 comprising an active core 524 surrounded by cladding 522 configured to allow ambient light to pass through to the active core 924. FIGS. 10B-D illustrate additional exemplary fiber waveguides 620,720,820 each including an active core surrounded by cladding. In at least some preferred implementations, a core has a cross-sectional diameter as small as a few microns, although in at least some other preferred implementations a core has a much larger cross-sectional diameter. In preferred implementations, a core has a large cross-sectional area relative to a cross-sectional area of the entire fiber waveguide, particularly as compared to a fiber optical line commonly utilized for telecommunications applications.

The core of each exemplary waveguide is characterized as active because it hosts material configured to absorb and emit light. These fiber waveguides preferably each include two exit ports, one at each end of the waveguide. In preferred implementations, to increase the efficiency of capturing light, a difference in refractive index between the core and cladding is maximized.

Figure 11A:
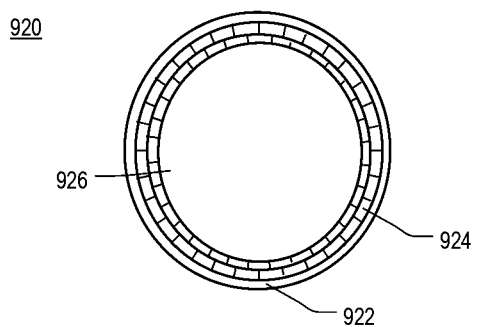
FIGS. 11A-B illustrate exemplary suspended core fiber optical waveguides in accordance with one or more aspects of the present invention.
Figure 11B:
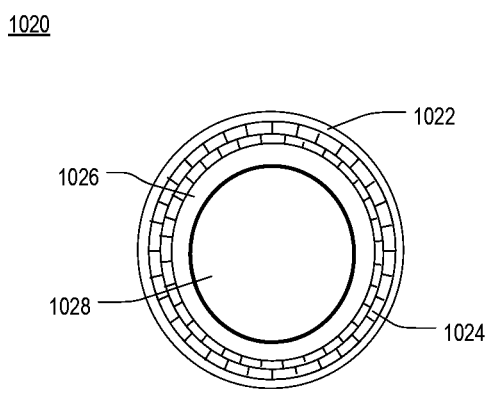

FIGS. 11A-B illustrate exemplary air clad, or suspended core, waveguides 920,1020 designed with such goal in mind. Both waveguide 920 of FIG. 11A and waveguide 1020 of FIG. 11B include an outer layer 922,1022, which may comprise a protective layer and/or an outer cladding layer, and a honeycomb cladding layer 924,1024 comprising mostly air, although it will be appreciated that in at least some other preferred implementations a layer comprising other low index material may be utilized. Waveguide 920 includes an active core 926 located inside these outer layers, while waveguide 1020 includes an active cladding layer 1026 and a core 1028 that is preferably not active. In this design, light generated in the active cladding layer 1026 will mostly propagate in the core 1028, thereby significantly reducing the chance of secondary absorption. In at least some preferred implementations, such waveguides are made in whole or in part from glass, while in at least some other preferred implementations, such waveguides are made in whole or in part from polymers.

Notably, details and functionality described herein with respect to layers of slab waveguides, or regions, is contemplated for use with fiber waveguides as well.

Coupling Minimization

It will be appreciated that waveguide 110 described hereinabove could be characterized as a multilayer waveguide owing to the presence of multiple layers 112,114,116. In at least some preferred implementations, multilayer, or multi-region, waveguides are utilized in a PV system or device.

Notably, although details of one or more preferred implementations are sometimes described herein in the context of waveguide "layers" of slab waveguides, implementation details described in this context are also contemplated for use with waveguide "regions", for example, in the context of waveguide regions of non-slab waveguides, and vice versa.

Figure 12A:
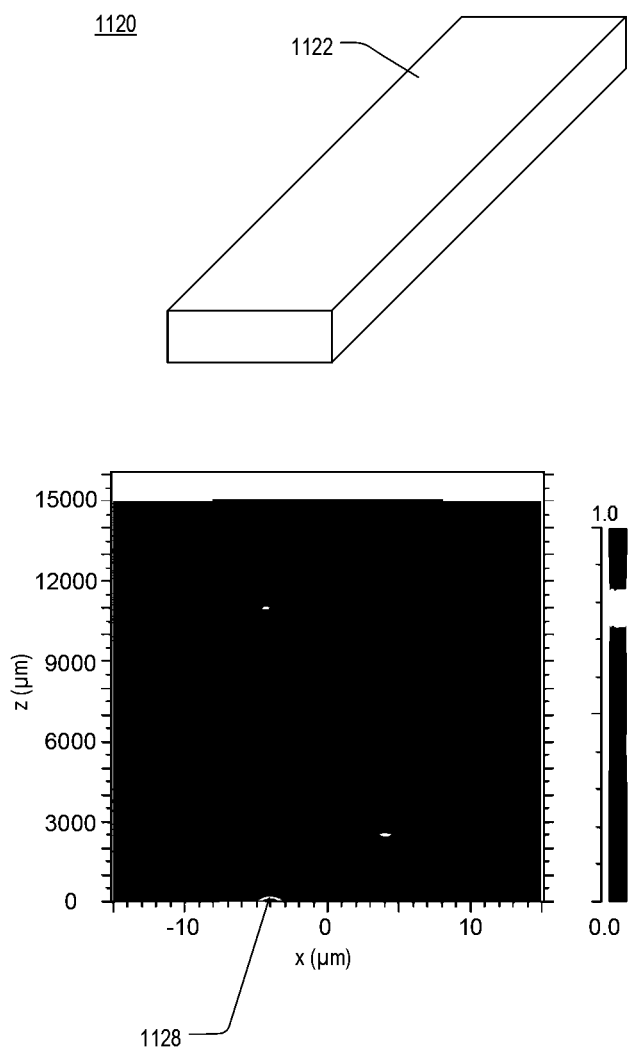
FIG. 12A illustrates wave propagation in an exemplary slab waveguide having a single core, based on illumination by a point light source.

It will be appreciated that, with respect to waveguides, boundary conditions can lead to the nature of guided modes. In addition, a difference in the index of refraction of a core relative to that of cladding determines a numerical aperture. It will further be appreciated that, in very large waveguide structures, it is very difficult to produce uniform boundaries, so optical loss in the boundaries becomes dominant FIG. 12A illustrates wave propagation in an exemplary slab waveguide 1120 having a core region 1122 based on illumination by a point light source 1128. For the sake of simplicity and clarity, claddings of the waveguide 1120 are not illustrated. The propagation of the field inside this waveguide has been simulated using propagation software available from RSoft Design Group, Inc. of Ossining, N.Y.

The width of the core region of waveguide 1120 is 20 microns. As illustrated, the electric field strength in the boundaries of the core and claddings is very high, therefore any non-uniformity in the boundary could cause the field to couple partially into the cladding and increase the optical loss.

Figure 12B:
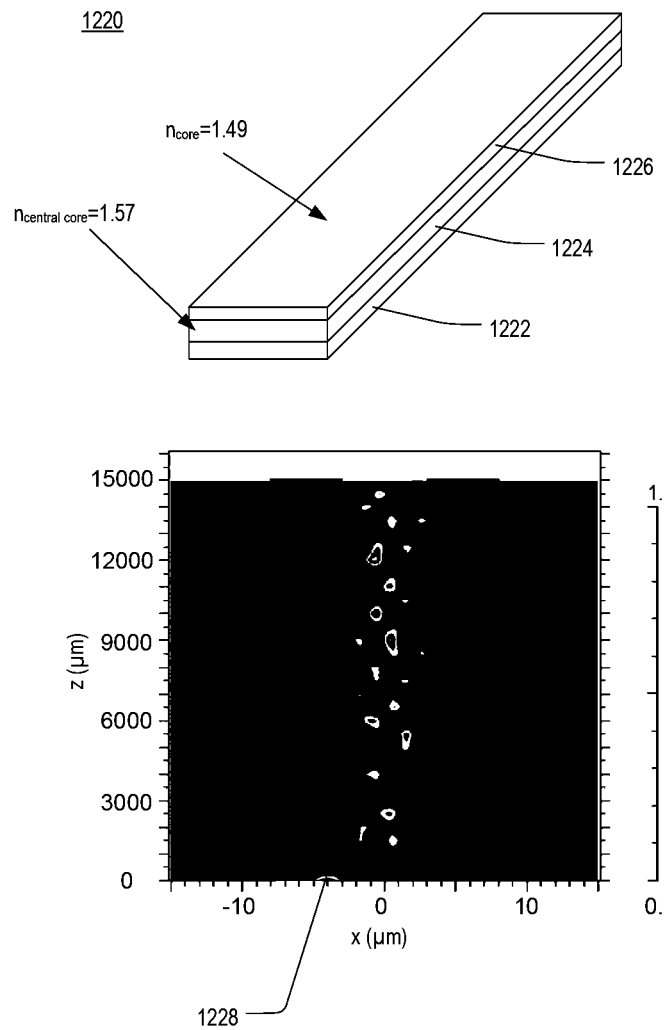
FIG. 12B illustrates wave propagation in an exemplary slab waveguide having three cores, based on illumination by a point light source.

By way of contrast, FIG. 12B illustrates a waveguide 1220 utilizing a triple core configuration. In this configuration, a central core region 1224 with a width of 10 microns lies at the center of the waveguide 1220. The central core region 1224 has a higher refractive index (1.57) than the other core regions 1222,1226 (1.49) of the waveguide 1220. The total width of all three core regions 1222,1224,1226 is the same as the width of core region 1122 of waveguide 1120, however, with respect to waveguide 1220, as illustrated in FIG. 12B, when a point source 1228 is similarly utilized to illuminate the waveguide 1220, most of the electric field is confined within the central core region 1224, and the field strength in the boundary of the core and cladding regions is significantly reduced. Any field coupling on the boundaries of the central core region 1224 will remain in one of the three core regions 1222,1224,1228. However, coupling to cladding modes will be reduced since the field has been weakened on the cladding boundaries. Notably, this is one example in which ray optics cannot fully describe waveguide performance because the width of each layer is very small.

In preferred implementations, waveguides comprising two or more core regions are utilized to minimize coupling effects. In a preferred implementation, a waveguide utilizing three or more core regions is utilized, where one or more central core regions have a higher index of refraction than other core regions. In some preferred implementations, one or more of these core regions is active, i.e. hosts material configured to absorb and emit light.

Minimizing Re-absorption

It will be appreciated that, when a waveguide hosts a complex dye that absorbs light over a large wavelength band, the dye could absorb some of its own emitted light. In one or more preferred implementations, a multilayer or multi-region waveguide includes material hosted at each region that works at different wavelength bands.

Figure 13A:
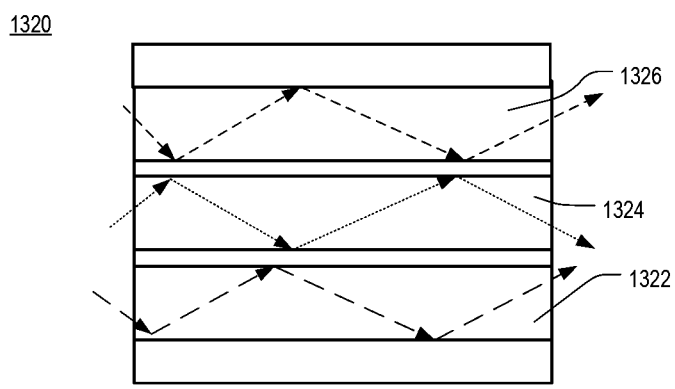
FIG. 13A illustrates an exemplary waveguide that includes three active cores.

In one or more preferred implementations, a waveguide comprising two or more active core regions, each hosting material configured to absorb light around a certain wavelength, and subsequently emit light, is utilized. Preferably, each core is configured such that light emitted by material hosted in that core is confined to that core. FIG. 13A illustrates a waveguide 1320 comprising three active cores. The waveguide 1320 is configured such that material hosted in each active core absorbs light at a different part of the sun's spectrum, and emitted light is confined at each core to prevent re-absorption.

In at least some implementations, a waveguide is configured such that, if emitted light from one layer or region escapes from that layer or region, it is absorbed by a next layer or region.

Figure 13B:
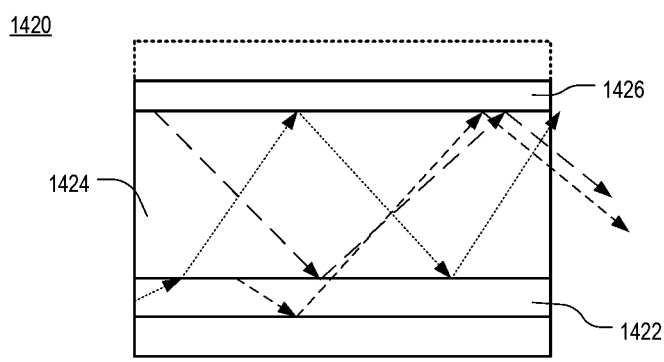
FIG. 13B illustrates an exemplary waveguide that includes two active layers and a passive waveguide core.

In one or more preferred implementations, a waveguide comprises one or more active regions (e.g. cladding regions) hosting material configured to absorb and emit light, as well as a core region that is outside the active regions. Preferably, the waveguide is configured such that light generated in each active region will travel in the core region and thus will not be reabsorbed by material hosted in the active regions. FIG. 13B illustrates an exemplary such waveguide 1420 having two active layers 1422,1426, and a passive waveguide core 1424. As illustrated, one or more additional cladding and/or protective layers may be utilized as well.

In at least some preferred implementations utilizing plasmon resonance for the infrared region of the spectrum, a waveguide comprises a lower layer or region incorporating metal nanoparticles and emitted light from this layer is absorbed and/or guided by other layers of the waveguide.

Color Provision

In one or more preferred implementations, a top layer or region of a waveguide is configured to visually provide a specific color. For example, in an exemplary preferred implementation, with reference to waveguide 1320 of FIG. 13A, the top core layer 1326 is configured to absorb, emit, and/or guide blue light so as to provide a blue color to the waveguide 1320. Preferably, the top core layer 1326 is configured to introduce more scattering than the other core layers 1322, 1324.

Figure 14:
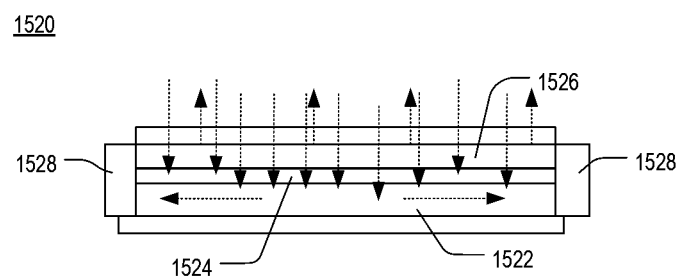
FIG. 14 illustrates an exemplary waveguide structure comprising two core layers separated by a cladding layer.

FIG. 14 illustrates an exemplary waveguide structure 1520 comprising two core layers 1522,1526 separated by a cladding layer 1524 (notably, as they are separated by cladding layers, the core layers could be characterized as separate waveguides, although they will be described herein as multiple core layers of a single waveguide). The top core layer 1526 absorbs light below $\lambda_1$ and transmits, or guides, any wavelength above this value. This core layer 1526 emits light above $\lambda_1$. The lower core layer 1522 absorbs light below $\lambda_2$, where $\lambda_2 > \lambda_1$. This core layer 1522 emits light with wavelengths above $\lambda_2$. In a preferred implementation, $\lambda_1$ is approximately 600 nm, and the emitted light in the top core layer 1526 is red. Preferably, scattering elements are incorporated in this core layer 1526, thereby, causing a surface of the waveguide to appear to have a red color. However, the lower core layer 1522 can effectively guide a near infrared emission to the solar strips. Thus, by varying the selection of $\lambda_1$ and $\lambda_2$, a desired surface color (e.g. red) can be achieved without impeding use of a portion of the solar spectrum.

Preferably, such a waveguide structure 1520 guides light to solar ribbons 1528, as illustrated in FIG. 14. In one or more preferred implementations, such a waveguide structure includes one or more additional cladding layers, as illustrated in FIG. 14, although in at least some preferred implementations such cladding may be omitted (e.g. air cladding may be utilized).

In one or more preferred implementations, such a methodology is utilized for fluorescent paint. This is possible owing to loss associated with an optical waveguide or due to the production of additional scattering loss.

Material Selection

Waveguides in accordance with various preferred implementations could be constructed utilizing glass, various types of sol-gels, polymers, silicones, or other suitable materials. Preferably, for long life applications where UV exposure could cause material properties to change, certain organic materials are not utilized.

Certain materials are better hosting mediums for certain types of dyes and quantum dots. In preferred implementations, such materials are selected for their compatibility with such dyes and quantum dots that are to be hosted therein.

It will be appreciated that some dyes and quantum dots are sensitive to humidity. In preferred implementations, such materials are protected from humid conditions, for example by a cladding layer and/or a protective layer of a waveguide. It will further be appreciated that oxygen can, in some cases, affect fluorescence as well. In preferred implementations, a waveguide material is selected, and or protecting cladding or coating is utilized, to protect fluorescent material from air which contains oxygen.

In one or more preferred implementations, a waveguide structure has a circular, elliptical or hexagonal cross sectional area which is very small relative to its length, which allows such waveguide to be treated as one dimensional.

Surface Application Implementations

In one or more preferred implementations, waveguide layers, including one or more active layers, are applied to a surface so as to effect creation of a waveguide on the surface. Notably, such application is possible even if the surface is rough, optically absorbent, and/or causes scattering.

Figure 15:
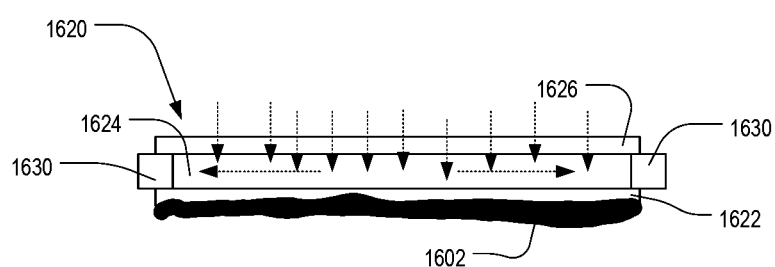
FIG. 15 illustrates a waveguide formed on a rough surface.

For example, FIG. 15 illustrates a waveguide 1620 formed on a rough surface 1602. Waveguide 1620 is formed by first applying a lower cladding layer 1622 over the rough surface, next applying an active core layer 1624 on top of the lower cladding layer 1622, and then finally applying an upper cladding layer 1626 on top of the active core layer 1624. The composition of cladding layer 1626 is selected to allow incident light to pass therethrough to core layer 1624, and the composition of core layer 1624 is selected to have a higher index of refraction than the cladding layers 1622,1626. In at least some preferred implementations, cladding layer 1622 is selected to be reflective, and/or a reflective coating will be applied prior to application of cladding 1622. In at least some preferred implementations, an anti-reflective layer is applied on top of the cladding layer 1626 to increase efficiency. Preferably, solar ribbons 1630 are disposed at ends of the core layer 1624 to convert light guided thereto to electrical energy.

Figure 16:
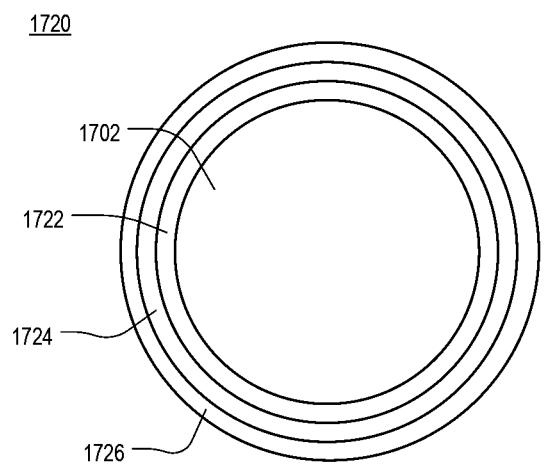
FIG. 16 illustrates a waveguide formed on the surface of a cylindrical post.

A waveguide could similarly be applied to a curved or contoured surface, such as, for example, a traffic light post or a street sign post. FIG. 16 illustrates a waveguide 1720 that has been formed on the curved surface of a cylindrical object. The waveguide 1720 includes an inner cladding layer 1722 applied to a cylindrical post 1702, a core layer 1724 applied on top of the inner cladding layer 1722, and an outer cladding layer 1726 applied on top of the core layer 1724. The composition of outer cladding layer 1726 is selected to allow incident light to pass therethrough to core layer 1724, and the composition of core layer 1724 is selected to have a higher index of refraction than the cladding layers 1722,1726. In at least some preferred implementations, cladding layer 1722 is selected to be reflective.

In preferred implementations, the core layer 1724 guides light to a ring-shaped solar cells disposed at one or more ring-shaped exit ports. Preferably, the solar cells are disposed proximate at, on, or proximate to the cylindrical surface the waveguide layers are applied to (e.g. solar ribbons disposed proximate a top and/or bottom of a traffic light post).

Although application of a waveguide structure to flat and cylindrical objects has been described herein, such application is possible to objects of various shapes and sizes.

Further, it will be appreciated that similar application techniques could be utilized to form waveguides having, for example, a passive core layer and one or more active cladding layers, and/or multiple active core layers. In one or more preferred implementations, some or all of these layers comprise planarized layers.

In one or more preferred implementations, one or more waveguide layers are applied via spin coating, spray coating, brushing, mist coating, doctor blade coating, screen coating, dip coating, calendaring, powder coating, lamination, gravure coating, roll coating, knife over roll coating, mayer rod coating, slot die coating, air knife coating, dipping, rolling, or as a film.

In one or more preferred implementations, one or more applied layers are configured to provide a selected color to the waveguide when illuminated by light, in accordance with methodologies described herein.

In some preferred implementations, one or more waveguide layers are applied to a material that itself is capable of functioning as a waveguide, such as glass or a dielectric material of this nature (e.g. plastic). Notably, in this event, the material can function as either a core layer or a cladding layer, depending on its index of refraction relative to the index of refraction of such applied layers.

Figure 17:
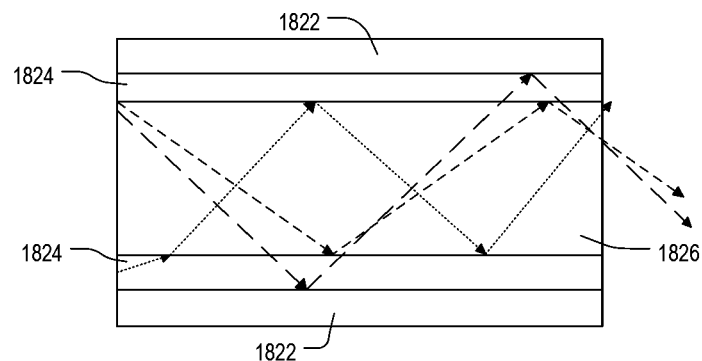
FIGS. 17-18 illustrate two exemplary cases involving application of waveguide structures to glass.

FIG. 17 illustrates a case where cladding layers 1822 and active waveguide layers 1824 are applied to the glass 1826 which has an index of refraction that is either greater than, or equal to, an index of refraction of the applied active waveguide layers 1824. In this case, light generated in the active layer is either confined within the glass 1826, or propagates in both the glass 1826 and the active waveguide layers 1824, as illustrated in FIG. 17.

Figure 18:
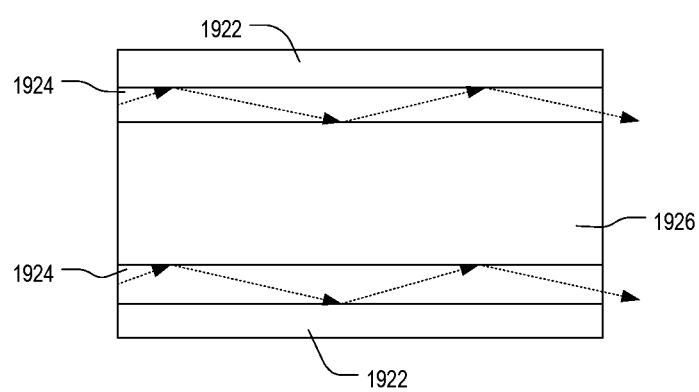

FIG. 18 illustrates a case where cladding layers 1922 and active waveguide layers 1924 are applied to the glass 1926 which has an index of refraction that is less than an index of refraction of the applied active waveguide layers 1924. In this case, the glass 1926 functions as cladding, as illustrated in FIG. 18.

In one or more preferred implementations, a waveguide structure is applied on regular glass for windows and doors. In some preferred implementations, the application of a waveguide structure to glass of standard windows and doors preferably allows such existing windows and doors to be utilized to generate electricity without necessitating the installation of a new windows or door.

Tempered Glass Applications

In some preferred implementations, material configured to absorb and emit light is utilized in a laminated/tempered glass context.

Laminated glass is commonly characterized as safety glass and is often used because of its safety, security and sound abatement characteristics. Laminated glass is particularly useful when it is desirable that glass maintain some of its structural integrity even after breakage.

Laminated glass can be produced by adhering two or more pieces of glass together with a vinyl layer using heat and pressure. In case of breakage, the vinyl layer, or interlayer, holds fragments of the glass pieces together and thus continues to provide resistance to the passage of persons or objects. The bond also holds the glass pieces together and prevents shattering and production of sharp shards which is typical of glass breakage.

The vinyl interlayer often comprises polyvinyl butyral (PVB), which is a resin commonly used for applications that require strong binding, optical clarity, adhesion to many surfaces, toughness, and flexibility. PVB has a melting point of around 90-120 degree Celsius and a refractive index of 1.48-1.5. Alternatively, the vinyl interlayer often comprises ethylene-vinyl acetate (EVA).

In some preferred implementations, material configured to absorb and emit light is hosted in an active layer of laminated glass.

Figure 19:
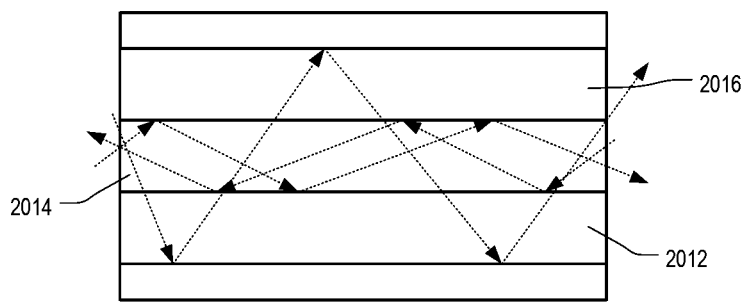
FIGS. 19-21 illustrate tempered glass in accordance with one or more aspects of the present invention.

FIG. 19 illustrates exemplary laminated glass 2010 comprising two layers of glass 2012,2016 and an active adhesive, or laminated, layer 2014. Laminated glass 2010 includes cladding layers 2022,2024, although in at least some preferred implementations air cladding will be utilized instead. Because the refractive index of adhesive layer 2014 is higher than that of the layers of glass 2012,2016, light is mostly concentrated in the adhesive layer 2014, and only partially travels in the layers of glass 2012,2016, as illustrated in FIG. 19.

Figure 20:
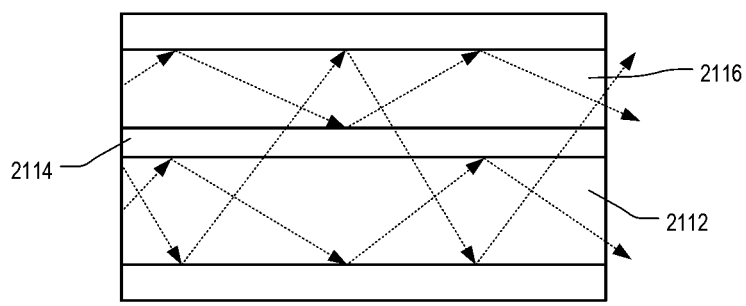

FIG. 20 illustrates additional exemplary laminated glass 2110. Like laminated glass 2010, laminated glass 2110 includes two layers of glass 2112,2116 and an active adhesive layer 2114. Laminated glass 2110 differs from laminated glass 2010, however, in that the refractive index of adhesive layer 2114 is lower than that of the layers of glass 2112,2116, thus causing light to be mostly confined in the layers of glass 2112,2116, as illustrated in FIG. 20.

Figure 21:
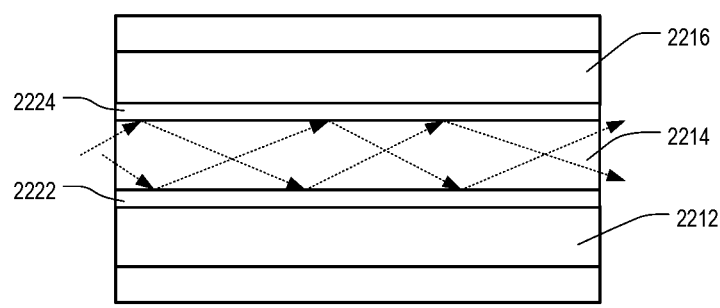

FIG. 21 illustrates yet additional exemplary laminated glass 2210. Laminated glass 2210 comprises three layers of glass 2212,2214,2216 and two active adhesive layers 2222, 2224. The refractive index of the center glass layer 2214 is higher than the refractive index of both the adhesive layers 2222,2224 and the other layers of glass 2212,2216, thus causing light generated in the active adhesive layers 2222,2224 to be mostly concentrated in the central glass layer 2214, thereby remaining well isolated from external contacts.

In one or more preferred implementations, an adhesive layer comprises PVB or EVA.

In some preferred implementations, optical fiber is incorporated into one or more adhesive layers with the ability to concentrate light for added mechanical strength. In at least one preferred implementation, such optical fiber includes one or more active layers. Such optical fiber may comprise a fiber optical waveguide described herein.

In one or more preferred implementations, pigments and/or dyes are added to a vinyl layer, such as, for example a vinyl layer comprising PVB or EVA, to create colored laminated glass.

Optical Structures

In one or more preferred implementations, a PV system or device incorporates one or more optical structures, such as, for example, a grating, prism, or angled surface, to redirect light.

Figure 22:
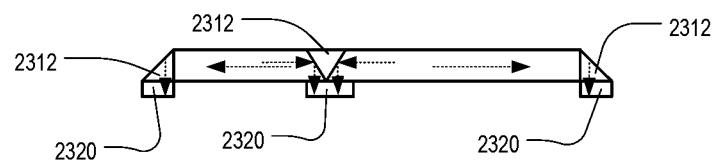
FIG. 22 illustrates the use of optical structures placed in, at, or proximate to a waveguide to direct light to solar cells.

For example, it is possible to position a strip of solar cells on some selected areas of a surface so that the solar cells receive light from a normal direction. However, since light produced and guided by the waveguide structure (e.g. coating film) propagates parallel to the surface of the waveguide (film), the light will not reach the solar cells. This can be solved by incorporating a right angle structure that causes light to be directed toward the solar cells. FIG. 22 illustrates how such reflectors 2312 could be placed in, at, or proximate to any portion of a waveguide to direct light to solar cells 2320.

In preferred implementations, waveguides utilize such optical structures. These optical structures could be made from the same material as the waveguides, or from other materials. Although the illustrated waveguides are both illustrated as utilizing air cladding, such optical structures could equally be utilized with waveguides utilizing different cladding materials.

In at least some preferred implementations, localized injection features, such as prisms, gratings, or scattering surfaces, are utilized to couple sun light into a waveguide directly. Rays that exceed the critical angle defined by Snell's Law propagate via total internal reflection (TIR) within the waveguide to an exit aperture, typically (in the case of a slab waveguide) at the edge of the slab. Preferably, in this way, a waveguide transports sunlight collected over an entire input aperture to solar cells placed at edges of the waveguide.

In one or more preferred implementations, structures or technologies could be utilized to facilitate delivery of light from a waveguide to a solar cell. Delivery of light from such a waveguide to a solar cell could be direct, via prism for out of plane installation of solar cells, via one or more micro lenses, via one or more cylindrical lenses, or via nano-structures at the edges of the waveguide. In at least some preferred implementations, such edges include anti-reflective coatings.

Fabric Implementations

In some preferred implementations, fiber waveguides including one or more active layers or regions are combined to produce woven or non-woven fabric configured to absorb, emit, and guide light.

For example, in a preferred implementation, polyester having a diameter as small as a few microns could be utilized.

In a preferred implementation, such fabric is utilized in constructing an article of clothing, such as, for example, a shirt, hat, or jacket, that guides light to solar cells disposed on, at, or proximate to the article of clothing.

In preferred implementations, a multilayer structure comprises an optical waveguide including an active layer (e.g. fabric as described hereinabove) as well as one or more structures for other purposes, such as, for example, heating, cooling, or energy storage. In one or more preferred implementations, a multi-layer fabric structure is configured to include one or more waveguide layers (including an active layer) as well as heating or cooling elements contained in another layer. Rather than simply including heating or cooling elements in another layer, the fabric structure may alternatively, or additionally, include layered structures configured for energy storage (e.g. capacitors and/or batteries).

In a preferred implementation, fabric configured to absorb, emit, and guide light is utilized in constructing an article configured to provide electrical energy for powering or charging a mobile electronic device. For example, in a preferred implementation, such fabric guides light to one or more solar ribbons, which convert the light to electrical energy, which is then transferred to a mobile electronic device via a charging outlet and/or plug.

Building Material Implementations

In one or more preferred implementations, a waveguide structure comprising one or more active layers or regions is incorporated into building materials, such as, for example, siding, windows, or roofing. In one or more preferred implementations, one or more waveguide layers are applied to building materials by being sprayed on or painted on, or as a film.

Further, in one or more preferred implementations, paint is configured to effect application of a waveguide structure including one or more active layers when applied to a surface. In a preferred implementation, a layer is added to the paint which includes fluorescent dye and which provides a specific color that is desired. This effect is aided by light scattering.

In at least some preferred implementations, such paint is then applied to a surface. For example, such paint could be used to paint bridges thus protecting them from humidity, and simultaneously allowing them to be used to guide light to solar cells for electricity generation.

Figure 23:
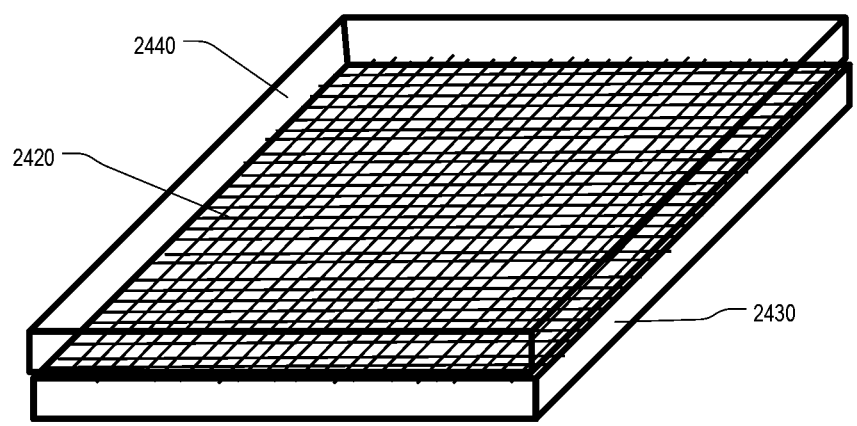
FIG. 23 illustrates a building material comprising fiber sandwiched between upper and lower structural layers.

In preferred implementations, fabric configured to absorb, emit, and guide light, as described herein, is sandwiched between two structural layers to form a building material, such as, for example, roofing material or a window. FIG. 23 illustrates building material comprising such a fabric 2420 as well as lower and upper structural layers 2430,2440. In one or more preferred implementations, lower layer 2430 is reflective. In some preferred implementations, two fabric layers are sandwiched between structural layers. In at least one preferred implementation, one such fabric layer is configured for energy up-conversion, while another such fabric layer is configured for energy down-conversion.

Closing

Based on the foregoing description, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention. Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements, the present invention being limited only by the claims appended hereto and the equivalents thereof.

What is claimed is:

1. A photovoltaic (PV) system comprising:
(a) a fiber optical waveguide including
(i) an active core hosting material configured to absorb and emit light,
(ii) a lattice cladding layer surrounding the active core, the lattice cladding layer being configured to allow ambient light to pass through the lattice cladding layer, and the lattice cladding layer comprising a plurality of air pockets defined within a lattice structure such that the lattice cladding layer comprises mostly air, and
(iii) an outer cladding layer surrounding the lattice cladding layer, the outer cladding layer being configured to allow ambient light to pass through the outer cladding layer, and being further configured to serve as a protective layer, and
(iv) an exit port located proximate an end of the waveguide; and
(b) one or more solar cells disposed at the exit port of the waveguide;
(c) wherein the waveguide is configured to guide light to the one or more solar cells; and (d) wherein a cross-sectional area of the active core of the fiber optical waveguide represents a majority of a cross-sectional area of the fiber optical waveguide.

2. The PV system of claim 1, wherein the material comprises a chromophore.

3. The PV system of claim 1, wherein the material comprises a photoluminescent material.

4. The PV system of claim 3, wherein the material comprises a fluorescent material.

5. The PV system of claim 1, wherein the material comprises a phosphorescent material.

6. The PV system of claim 1, wherein the material comprises quantum dots.

7. The PV system of claim 1, wherein the material comprises a dye.

8. The PV system of claim 1, wherein the material comprises an organic dye.

9. The PV system of claim 1, wherein a cross-sectional area of the active core of the fiber optical waveguide represents 75% or more of a cross-sectional area of the fiber optical waveguide.

10. The PV system of claim 1, wherein the cross-sectional diameter of the active core is a few microns.

11. The PV system of claim 1, wherein the active core has a cross-sectional diameter of a few microns.

12. The PV system of claim 1, wherein the one or more solar cells comprise a solar ribbon.

13. A fiber optical waveguide comprising:
(a) an active core hosting material configured to absorb and emit light;
(b) a lattice cladding layer surrounding the active core, the lattice cladding layer being configured to allow ambient light to pass through the lattice cladding layer, and the lattice cladding layer comprising a plurality of air pockets defined within a lattice structure such that the lattice cladding layer comprises mostly air;
(c) an outer cladding layer surrounding the lattice cladding layer, the outer cladding layer being configured to allow ambient light to pass through the outer cladding layer, and being further configured to serve as a protective layer; and (d) an exit port located proximate an end of the waveguide;
(e) wherein the waveguide is configured to guide light to the exit port; and
(f) wherein a cross-sectional area of the active core of the fiber optical waveguide represents 75% or more of a cross-sectional area of the fiber optical waveguide.

14. The PV system of claim 1, wherein there are one or more layers disposed between the active core and the lattice cladding layer.

15. The PV system of claim 1, wherein there are one or more layers disposed between the outer cladding layer and the lattice cladding layer.

16. The PV system of claim 1, wherein the lattice structure comprises a honeycomb structure.

17. The PV system of claim 1, wherein the fiber optical waveguide has a circular cross-sectional shape.

18. The PV system of claim 1, wherein the fiber optical waveguide has an elliptical cross-sectional shape.

19. The PV system of claim 1, wherein the fiber optical waveguide has a hexagonal cross-sectional shape.

20. A fiber optical waveguide comprising:
(a) a passive central core;
(b) an active cladding layer surrounding the passive central core, the active cladding layer hosting material configured to absorb and emit light;
(c) one or more lattice cladding layers surrounding the active cladding layer, the one or more lattice cladding layers being configured to allow ambient light to pass through the one or more lattice cladding layers from an exterior of the fiber optical waveguide, and the one or more lattice cladding layers comprising a plurality of air pockets defined within a lattice structure such that the lattice one or more cladding layers comprise mostly air; and
(c) an outer cladding layer surrounding the one or more lattice cladding layers, the outer cladding layer being configured to allow ambient light to pass through the outer cladding layer from an exterior of the fiber optical waveguide, and being further configured to serve as a protective layer; and
(d) an exit port located proximate each end of the waveguide;
(e) wherein the core is configured to confine light emitted by the material hosted in the active cladding layer that passes into the core;
(f) wherein the waveguide is configured to guide light to the exit ports; and
(g) wherein a cross-sectional area of the core of the fiber optical waveguide represents a majority of a cross-sectional area of the fiber optical waveguide.

* * * * *